(12) United States Patent
Jeong et al.

(10) Patent No.: US 12,245,464 B2
(45) Date of Patent: *Mar. 4, 2025

(54) DISPLAY PANEL AND DISPLAY APPARATUS INCLUDING THE SAME

(71) Applicant: SAMSUNG DISPLAY CO., LTD., Yongin-si (KR)

(72) Inventors: Junki Jeong, Yongin-si (KR); Hyunho Kim, Yongin-si (KR); Sunyoung Jung, Yongin-si (KR); Meehye Jung, Yongin-si (KR); Seonyoung Choi, Yongin-si (KR); Donghwan Shim, Yongin-si (KR); Sanghee Jang, Yongin-si (KR); Chungsock Choi, Yongin-si (KR); Juhoon Kang, Yongin-si (KR); Gunhee Kim, Yongin-si (KR); Taehoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/486,024

(22) Filed: Oct. 12, 2023

(65) Prior Publication Data

US 2024/0040838 A1 Feb. 1, 2024

Related U.S. Application Data

(63) Continuation of application No. 17/211,676, filed on Mar. 24, 2021, now Pat. No. 11,793,032.

(30) Foreign Application Priority Data

Aug. 6, 2020 (KR) ........................ 10-2020-0098818

(51) Int. Cl.
*H10K 59/121* (2023.01)
*H10K 59/123* (2023.01)
(Continued)

(52) U.S. Cl.
CPC ...... *H10K 59/1216* (2023.02); *H10K 59/1213* (2023.02); *H10K 59/123* (2023.02); *H10K 59/124* (2023.02); *H01L 27/1214* (2013.01)

(58) Field of Classification Search
CPC .... H10K 59/13; H10K 59/123; H10K 59/124; H10K 59/1213; H10K 59/1216;
(Continued)

(56) References Cited

U.S. PATENT DOCUMENTS

2002/0196228 A1* 12/2002 Hirayama ........... H04M 1/0243
345/156
2007/0159076 A1 7/2007 Park et al.
(Continued)

FOREIGN PATENT DOCUMENTS

CN 110047897 A 7/2019
CN 110288945 A 9/2019
(Continued)

*Primary Examiner* — Shaheda A Abdin
(74) *Attorney, Agent, or Firm* — Womble Bond Dickinson (US) LLP

(57) ABSTRACT

A display panel includes: a substrate including a main display area, a component area, and a peripheral area; a main sub-pixel at the main display area on the substrate; a main pixel circuit connected to the main sub-pixel, and including a main storage capacitor; an auxiliary sub-pixel at the component area on the substrate; an auxiliary pixel circuit at the peripheral area on the substrate, and including an auxiliary storage capacitor; and a connecting line connecting the auxiliary sub-pixel to the auxiliary pixel circuit. A capacity of the auxiliary storage capacitor is greater than a capacity of the main storage capacitor.

20 Claims, 19 Drawing Sheets

(51) Int. Cl.
*H10K 59/124* (2023.01)
*H01L 27/12* (2006.01)

(58) Field of Classification Search
CPC .. H10K 59/121; H10K 59/65; H01L 27/1255; H01L 27/1214
See application file for complete search history.

(56) References Cited

U.S. PATENT DOCUMENTS

| | | |
|---|---|---|
| 2008/0237582 A1 | 10/2008 | Cho et al. |
| 2013/0106839 A1 | 5/2013 | Kim et al. |
| 2014/0191228 A1 | 7/2014 | Jung et al. |
| 2015/0212374 A1* | 7/2015 | Uejima ............ G02F 1/134309 349/43 |
| 2016/0148989 A1 | 5/2016 | Jin et al. |
| 2018/0366586 A1 | 12/2018 | Son et al. |
| 2022/0310574 A1 | 9/2022 | Kim et al. |

FOREIGN PATENT DOCUMENTS

| | | |
|---|---|---|
| CN | 111063719 A | 4/2020 |
| CN | 111180494 A | 5/2020 |
| KR | 10-2020-0037029 A | 4/2020 |
| KR | 10-2020-0058891 A | 5/2020 |

\* cited by examiner

DISPLAY PANEL AND DISPLAY APPARATUS INCLUDING THE SAME

CROSS-REFERENCE TO RELATED APPLICATIONS

This application is a continuation of U.S. patent application Ser. No. 17/211,676, filed Mar. 24, 2021, which claims priority to and the benefit of Korean Patent Application No. 10-2020-0098818, filed Aug. 6, 2020, the entire content of both of which is incorporated herein by reference.

BACKGROUND

1. Field

Aspects of one or more example embodiments of the present disclosure relate to a display panel, and a display apparatus including the display panel. More particularly, aspects of one or more example embodiments of the present disclosure relate to a display panel having an expanded display area so as to display images at (e.g., in or on) a region where a component (e.g., an electronic element) is provided, and a display apparatus including the display panel.

2. Description of Related Art

Recently, the usage of display devices has diversified. Also, display devices have become thinner and lighter, and thus, the uses of display devices have expanded.

According to the usage of the display apparatuses, different methods of designing a shape thereof have been developed, and more functions have been embedded in or linked to the display apparatuses.

The above information disclosed in this Background section is for enhancement of understanding of the background of the present disclosure, and therefore, it may contain information that does not constitute prior art.

SUMMARY

One or more example embodiments of the present disclosure are directed to a display panel having an expanded display area so as to display images at (e.g., in or on) a region where a component (e.g., an electronic element) is provided, and a display apparatus including the display panel. However, the aspects and features of the present disclosure are not limited thereto.

Additional aspects and features of the present disclosure will be set forth, in part, in the description which follows, and in part, will be apparent from the description, or may be learned by practicing one or more of the presented embodiments of the present disclosure.

According to one or more example embodiments of the present disclosure, a display panel includes: a substrate including a main display area, a component area, and a peripheral area; a main sub-pixel at the main display area on the substrate; a main pixel circuit connected to the main sub-pixel, and including a main storage capacitor; an auxiliary sub-pixel at the component area on the substrate; an auxiliary pixel circuit at the peripheral area on the substrate, and including an auxiliary storage capacitor; and a connecting line connecting the auxiliary sub-pixel to the auxiliary pixel circuit. A capacity of the auxiliary storage capacitor is greater than a capacity of the main storage capacitor.

In an example embodiment, the display panel may further include: a main scan line configured to transfer a scan signal to the main pixel circuit; and an auxiliary scan line configured to transfer a scan signal to the auxiliary pixel circuit. The main sub-pixel may be at a same row as that of the auxiliary sub-pixel, and the auxiliary scan line may be connected to the main scan line via a scan connecting line to receive a same signal as that of the main scan line.

In an example embodiment, the display panel may further include: a main data line configured to transfer a data signal to the main pixel circuit; an auxiliary data line configured to transfer a data signal to the auxiliary pixel circuit; and a data connecting line connecting the main data line to the auxiliary data line. The main data line and the auxiliary data line may be spaced from each other with the component area therebetween, and the data connecting line may bypass the component area in the main display area.

In an example embodiment, an end of the connecting line may extend to an edge of the component area.

In an example embodiment, the connecting line may include a first connecting line at the peripheral area, and a second connecting line at the component area, and the first connecting line and the second connecting line may include different materials from each other.

In an example embodiment, the first connecting line may have a higher conductivity than a conductivity of the second connecting line, and the second connecting line may have a higher light transmittance than a light transmittance of the first connecting line.

In an example embodiment, the main sub-pixel and the auxiliary sub-pixel may be configured to emit light of a same color as each other, and the auxiliary sub-pixel may have a greater size than a size of the main sub-pixel.

In an example embodiment, an area occupied by the auxiliary pixel circuit may be greater than an area occupied by the main pixel circuit.

In an example embodiment, the auxiliary storage capacitor may include a first lower electrode, a second lower electrode, and an upper electrode, and the first lower electrode and the second lower electrode may be at a same layer as each other and spaced from each other.

In an example embodiment, the connecting line may include a first connecting line and a second connecting line, the first connecting line including a different material from that of the second connecting line. The first connecting line and the second connecting line may be at a same layer as each other, and an end of the second connecting line may cover an end of the first connecting line.

In an example embodiment, the connecting line may include a first connecting line and a second connecting line, the first connecting line including a different material from that of the second connecting line, and the first connecting line and the second connecting line may be at different layers from each other and connected to each other via a contact hole.

In an example embodiment, the auxiliary sub-pixel may include an auxiliary display element, the display panel may further include: an inorganic insulating layer between the substrate and the auxiliary display element; and a planarization layer between the inorganic insulating layer and the auxiliary display element, the inorganic insulating layer may have a hole or a groove at the component area, and the planarization layer may be filled in the hole or the groove.

In an example embodiment, the auxiliary sub-pixel may include a first auxiliary sub-pixel, and a second auxiliary sub-pixel, and the first auxiliary sub-pixel may correspond to a first light-emitting region and the second auxiliary sub-pixel may correspond to a second light-emitting region of one display element.

In an example embodiment, the auxiliary sub-pixel may include a plurality of auxiliary sub-pixels and the auxiliary pixel circuit may include a plurality of auxiliary pixel circuits. N auxiliary sub-pixels may be arranged at the component area along a first direction, and N auxiliary pixel circuits may be arranged at the peripheral area along the first direction, where N is an integer.

In an example embodiment, the auxiliary pixel circuit may include a plurality of auxiliary pixel circuits, and a width of a region in a second direction where the plurality of auxiliary pixel circuits are located may be greater than a width of the component area in the second direction.

In an example embodiment, the auxiliary pixel circuit may include a plurality of auxiliary pixel circuits that are arranged in a stair shape from an edge of the display panel to a center of the display panel at the peripheral area.

According to one or more example embodiments of the present disclosure, a display apparatus includes: a display panel including: a substrate; a main display area including main sub-pixels; main pixel circuits at the main display area, each of the main pixel circuits including a main storage capacitor; a component area including auxiliary sub-pixels; a peripheral area; auxiliary pixel circuits at the peripheral area, each of the auxiliary pixel circuits including an auxiliary storage capacitor; and connecting lines connecting the auxiliary sub-pixels to the auxiliary pixel circuits; and a component under the display panel at the component area. A capacity of the auxiliary storage capacitor is greater than a capacity of the main storage capacitor.

In an example embodiment, each of the connecting lines at the component area may include a transparent conductive oxide material.

In an example embodiment, the display apparatus may further include: main data lines configured to transfer a data signal to the main pixel circuits; auxiliary data lines configured to transfer a data signal to the auxiliary pixel circuits; and data connecting lines connecting the main data lines to the auxiliary data lines, respectively. The main data lines and the auxiliary data lines may be spaced from each other with the component area therebetween, and the data connecting lines may bypass the component area in the main display area.

In an example embodiment, ends of the connecting lines may extend to an edge of the component area.

In an example embodiment, each of the connecting lines may include a first connecting line at the peripheral area and a second connecting line at the component area, and the first connecting line and the second connecting line may include different materials from each other.

In an example embodiment, the auxiliary storage capacitor may include a first lower electrode, a second lower electrode, and an upper electrode, and the first lower electrode and the second lower electrode may be at a same layer as each other and may be spaced from each other.

In an example embodiment, each of the connecting lines may include a first connecting line, and a second connecting line including a different material from that of the first connection line, the first connecting line and the second connecting line may be at a same layer as each other, and an end of the second connecting line may cover an end of the first connecting line.

In an example embodiment, N auxiliary sub-pixels may be arranged at the component area along a first direction, and N auxiliary pixel circuits may be arranged at the peripheral area along the first direction, where N is an integer.

In an example embodiment, the auxiliary pixel circuits may be arranged in a stair shape from an edge of the display panel to a center of the display panel at the peripheral area.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
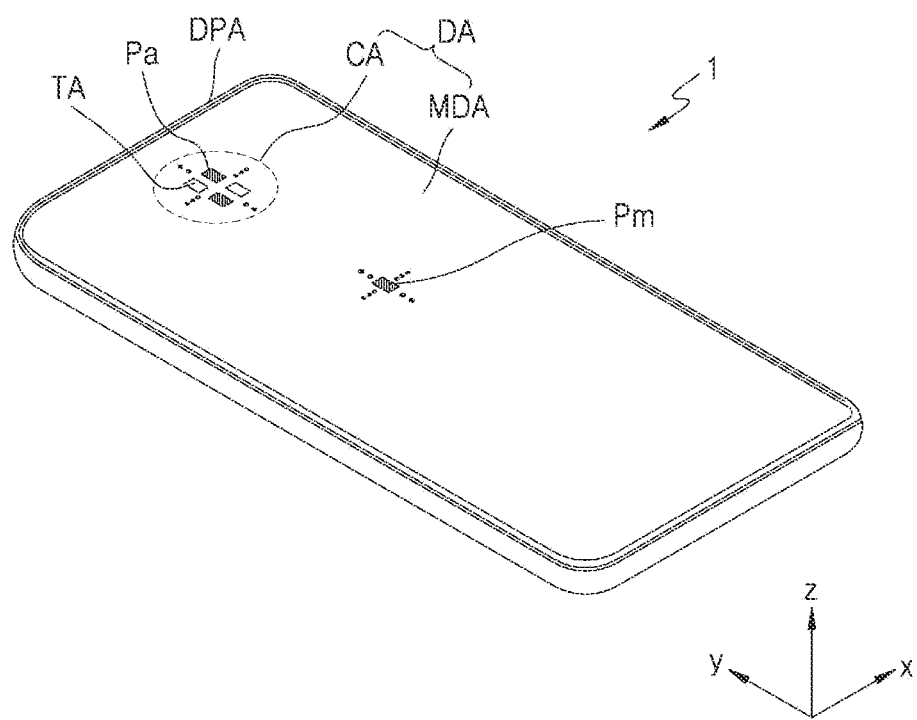
FIG. 1 is a perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the following examples, the x-axis, the y-axis, and the z-axis are not limited to three axes of the rectangular coordinate system, and may be interpreted in a broader sense. For example, the x-axis, the y-axis, and the z-axis may be different directions that are perpendicular to or substantially perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 includes a display area DA, and a peripheral area DPA at (e.g., in or on) an outer portion of the display area DA. The display area DA may include a component area CA, and a main display area MDA at least partially surrounding (e.g., around a periphery of) the component area CA. In other words, the component area CA and the main display area MDA may separately display an image, or may display an image together. The peripheral area DPA may be a non-display area at (e.g., in or on) which pixels are not arranged. The display area DA may be entirely surrounded (e.g., around a periphery thereof) by the peripheral area DPA.

In FIG. 1, one component area CA is shown at (e.g., in or on) the main display area MDA, but the present disclosure is not limited thereto. In another embodiment, the display apparatus 1 may include two or more component areas CA, and the shapes and/or sizes of the plurality of component areas CA may be different from one another, or may be the same or substantially the same as each other. When viewed from a direction perpendicular to or substantially perpendicular to an upper surface of the display apparatus 1 (e.g., in a plan view), the component area CA may have various suitable shapes, for example, such as a circular shape, an elliptical shape, a polygonal shape, for example, such as a square shape, a star shape, or a diamond shape, and/or the like. In addition, in FIG. 1, the component area CA is shown to be located at (e.g., in or on) an upper (e.g., in a +y direction) center of the main display area MDA that has a rectangular shape when viewed from the direction perpendicular to or substantially perpendicular to the upper surface of the display apparatus 1, but the present disclosure is not limited thereto, and the component area CA may be located at, for example, a side (e.g., an upper right side or an upper left side) of the main display area MDA having the rectangular shape.

The display apparatus 1 may provide images by using a plurality of main sub-pixels Pm at (e.g., in or on) the main display area MDA and a plurality of auxiliary sub-pixels Pa at (e.g., in or on) the component area CA.

As described in more detail below with reference to FIG. 2, a component 40, or in other words, an electronic element, may be located under (e.g., underneath) the display panel to correspond to the component area CA. The component 40 may include a camera that uses an infrared ray or a visible ray, and may include an imaging device. As another example, the component 40 may include a solar battery, a flash, an illuminance sensor, a proximity sensor, and/or an iris sensor. As another example, the component 40 may have a function of receiving sound, for example, such as a microphone. In order to reduce restrictions in the functions of the component 40, the component area CA may include a transmission area TA through which light and/or sound output from the component 40 to the outside may pass, and/or through which light and/or sound proceeding from the outside toward the component 40 may pass. In the display panel or the display apparatus including the display panel according to an embodiment, when light passes through the component area CA, a light transmittance thereof may be about 10% or greater, for example, such as 25% or greater, 40% or greater, 50% or greater, 85% or greater, or 90% or greater.

The plurality of auxiliary sub-pixels Pa may be arranged at (e.g., in or on) the component area CA. The plurality of auxiliary sub-pixels Pa may emit light to provide a desired image (e.g., a predetermined or certain image). An image displayed at (e.g., in or on) the component area CA may be referred to as an auxiliary image, and may have a lower resolution than that of an image displayed at (e.g., in or on) the main display area MDA. In other words, the component area CA may include the transmission area TA through which light and/or sound may be transmitted, and when there is no sub-pixel arranged at (e.g., in or on) the transmission area TA, the number of auxiliary sub-pixels Pa per unit area at (e.g., in or on) the component area CA may be less than the number of main sub-pixels Pm per unit area at (e.g., in or on) the main display area MDA.

Figure 2A:
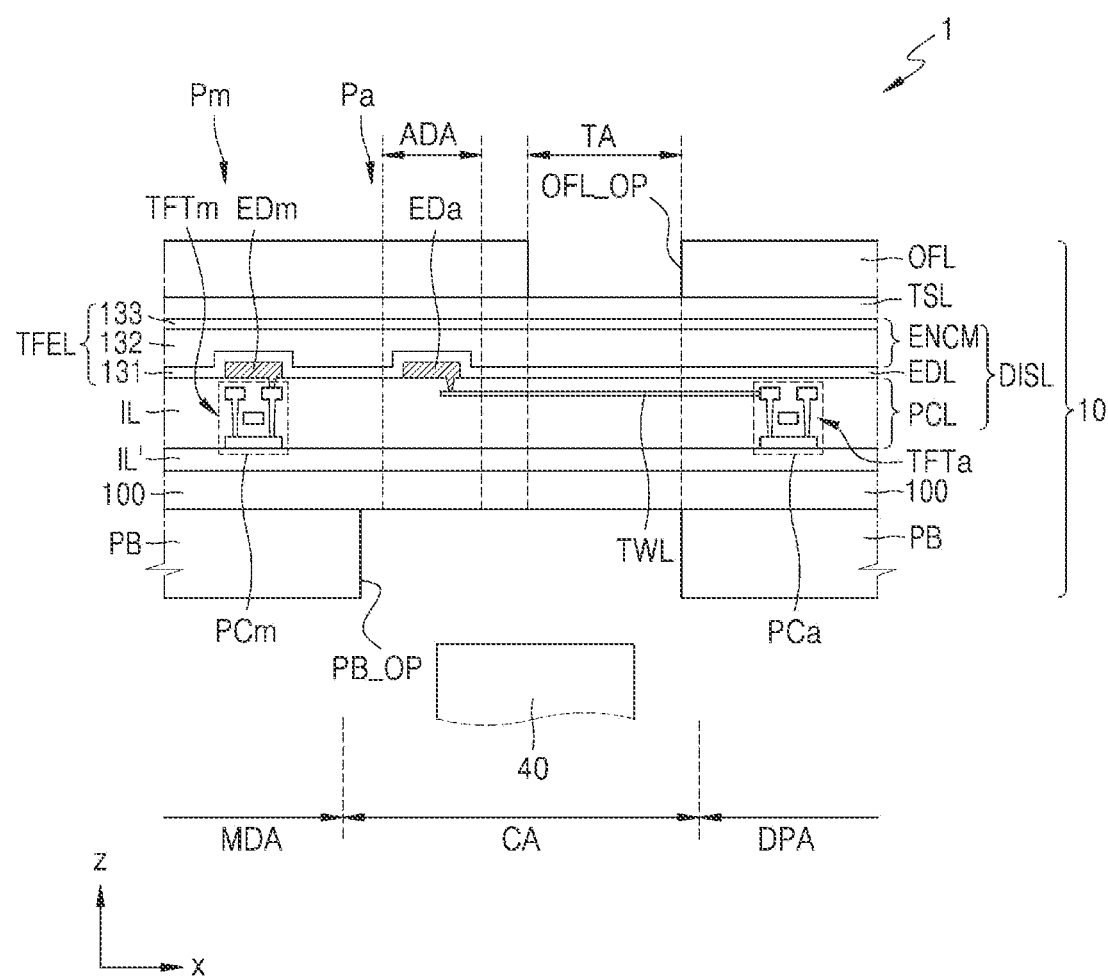
FIG. 2A is a cross-sectional view partially showing a display apparatus according to an embodiment.
Figure 2B:
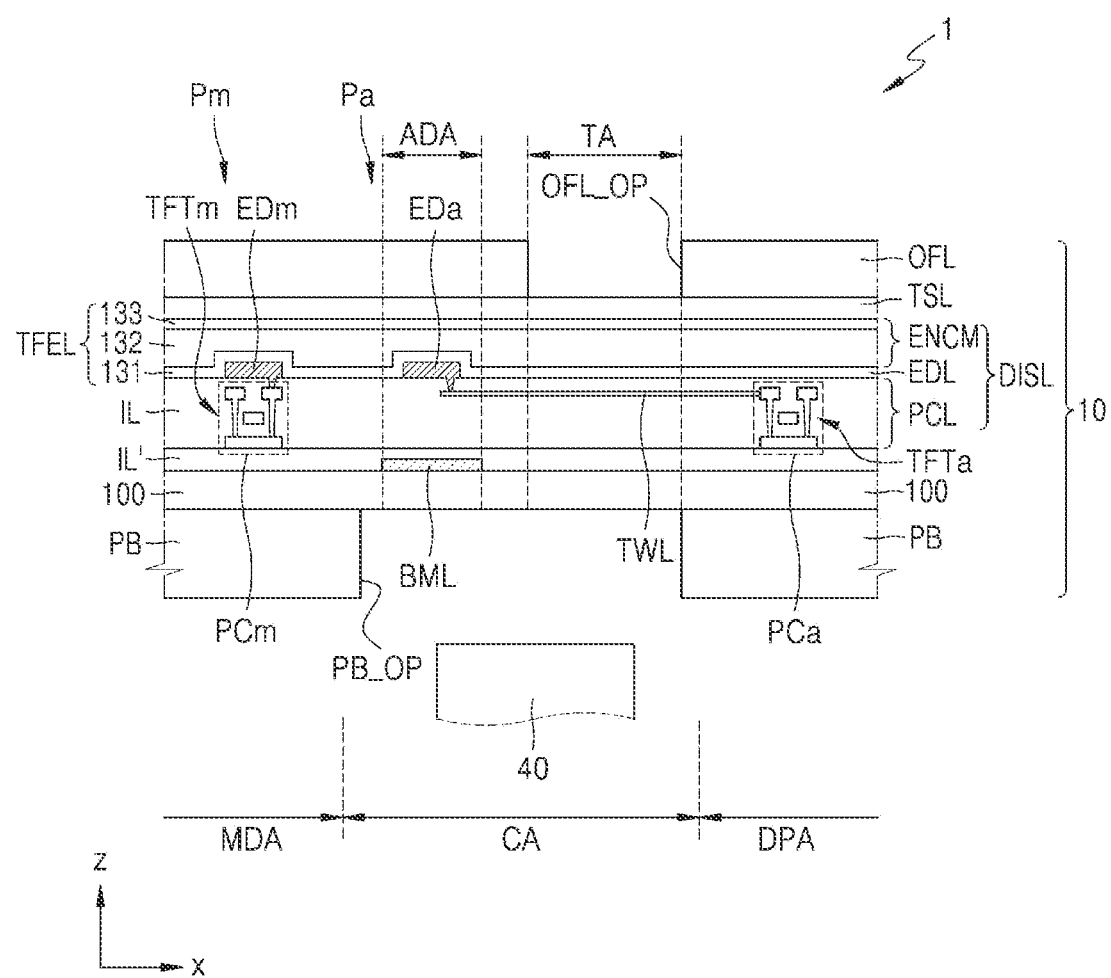
FIG. 2B is a cross-sectional view partially showing a display apparatus according to an embodiment.

FIGS. 2A and 2B are cross-sectional views partially showing the display apparatus 1 according to one or more embodiments.

Referring to FIG. 2A, the display apparatus 1 may include a display panel 10, and the component 40 overlapping with the display panel 10. A cover window for protecting the display panel 10 may be further arranged above the display panel 10.

The display panel 10 includes the component area CA corresponding to a region overlapping with the component 40, and the main display area MDA for displaying main images. The display panel 10 may include a substrate 100, a display layer DISL on the substrate 100, a touch screen layer TSL, an optical functional layer OFL, and a panel protective member PB under (e.g., underneath) the substrate 100.

The display layer DISL may include a circuit layer PCL including thin film transistors TFTm and TFTa, a display element layer EDL including light-emitting elements EDm and EDa that are display elements, and an encapsulation member ENCM such as a thin film encapsulation layer TFEL or a sealing substrate. Insulating layers IL and IL' may be between the substrate 100 and the display layer DISL, and in the display layer DISL.

The substrate 100 may include an insulating material, for example, such as glass, quartz, and/or a polymer resin. The substrate 100 may be a rigid substrate, or may be a flexible substrate that is bendable, foldable, and/or rollable.

A main pixel circuit PCm, and a main light-emitting device EDm connected to the main pixel circuit PCm may be at (e.g., in or on) the main display area MDA of the display panel 10. The main pixel circuit PCm includes at least one thin film transistor TFTm, and may control light emission from the main light-emitting device EDm. The main sub-pixel Pm may be implemented by light emission of the main light-emitting device EDm.

An auxiliary light-emitting device EDa is at (e.g., in or on) the component area CA of the display panel 10 to implement the auxiliary pixel Pa. In the present embodiment, the auxiliary pixel circuit PCa for driving the auxiliary light-emitting device EDa may not be at (e.g., in or on) the component area CA, but may be at (e.g., in or on) the peripheral area DPA corresponding to a non-display area. In another embodiment, the auxiliary pixel circuit PCa may be partially at (e.g., in or on) the main display area MDA, or may be between the main display area MDA and the component area CA. In other words, the auxiliary pixel circuit PCa may be provided to not overlap with the auxiliary light-emitting device EDa.

The auxiliary pixel circuit PCa may include at least one thin film transistor TFTa, and may be electrically connected to the auxiliary light-emitting device EDa via a connecting line TWL. The connecting line TWL may include a transparent conductive material. The auxiliary pixel circuit PCa may control the light emission from the auxiliary light-emitting device EDa. The auxiliary sub-pixel Pa may be implemented by the light emission from the auxiliary light-emitting device EDa. In the component area CA, a region where the auxiliary light-emitting device EDa is provided may be referred to as an auxiliary display area ADA.

Also, in the component area CA, a region where the auxiliary light-emitting device EDa that is a display element is not provided may be referred to as a transmission area TA. The transmission area TA may be a region through which light/signal emitted from the component 40 or light/signal incident on the component 40 that corresponds to the component area CA may be transmitted. The auxiliary display area ADA and the transmission area TA may be alternately arranged at (e.g., in or on) the component area CA. The connecting line TWL for connecting the auxiliary pixel circuit PCa and the auxiliary light-emitting device EDa to each other may be at (e.g., in or on) the transmission area TA. The connecting line TWL may include a transparent conductive material having a high transmittance, and thus, even when the connecting line TWL is at (e.g., in or on) the transmission area TA, the transmittance of the transmission area TA may be secured.

In the present embodiment, because the auxiliary pixel circuit PCa is not at (e.g., in or on) the component area CA, an area of the transmission area TA may be ensured, and the light transmittance thereof may be further improved.

The display element layer EDL may be covered by the thin film encapsulation layer TFEL or by an encapsulation substrate. In one or more embodiments, the thin film encapsulation layer TFEL may include at least one inorganic encapsulation layer and at least one organic encapsulation layer, as shown in FIG. 2A. In an embodiment, the thin film encapsulation layer TFEL may include first and second inorganic encapsulation layers 131 and 133, and an organic encapsulation layer 132 between the first and second inorganic encapsulation layers 131 and 133.

The first and second inorganic encapsulation layers 131 and 133 may each include one or more inorganic insulating materials, for example, such as silicon oxide ($SiO_2$), silicon nitride (SiNx), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$), and may be formed by a chemical vapor deposition (CVD) method and/or the like. The organic encapsulation layer 132 may include a polymer-based material. Examples of the polymer-based material may include silicone resin, acrylic resin, epoxy resin, polyimide, polyethylene, or the like.

The first inorganic encapsulation layer 131, the organic encapsulation layer 132, and the second inorganic encapsulation layer 133 may be integrally provided to cover the main display area MDA and the component area CA.

In some embodiments, when the display element layer EDL is sealed by the encapsulation substrate (e.g., instead of by the encapsulation layer TFEL shown in FIG. 2A), the encapsulation substrate may face the substrate 100 with the display element layer EDL therebetween. There may be a gap between the encapsulation substrate and the display element layer EDL. The encapsulation substrate may include glass. A sealant including frit and/or the like may be disposed between the substrate 100 and the encapsulation substrate, and the sealant may be at (e.g., in or on) the peripheral area DPA. The sealant at (e.g., in or on) the peripheral area DPA may surround (e.g., around a periphery of) the display area DA to prevent or substantially prevent moisture from infiltrating through side surfaces.

The touch screen layer TSL may obtain coordinate information according to an external input, for example, such as a touch event. The touch screen layer TSL may include a touch electrode, and touch lines connected to the touch electrode. The touch screen layer TSL may sense the external input according to a self-capacitance method or a mutual capacitance method.

The touch screen layer TSL may be on the thin-film encapsulation layer TFEL. As another example, the touch screen layer TSL may be separately formed on a touch substrate, and then may be coupled onto (e.g., connected onto) the thin film encapsulation layer TFEL via an adhesive layer, for example, such as an optical clear adhesive (OCA). In an embodiment, the touch screen layer TSL may be directly on the thin film encapsulation layer TFEL, and in this case, the adhesive layer may not be provided between the touch screen layer TSL and the thin film encapsulation layer TFEL.

The optical functional layer OFL may include an anti-reflection layer. The anti-reflection layer may reduce a reflectivity of light (e.g., a reflectivity of external light) incident into the display apparatus 1 from the outside.

In some embodiments, the optical functional layer OFL may include a polarization film. The optical functional layer OFL may include an opening OFL_OP corresponding to the transmission area TA. Accordingly, the light transmittance of the transmission area TA may be improved (e.g., may be significantly improved). A transparent material, for example, such as an optically clear resin (OCR), may be filled in the opening OFL_OP.

In some embodiments, the optical functional layer OFL may include a filter plate including a black matrix and color filters.

The panel protective member PB is attached to a lower portion (e.g., a rear surface) of the substrate 100 in order to support and protect the substrate 100. The panel protection member PB may include an opening PB_OP corresponding to the component area CA. The inclusion of the opening PB_OP in the panel protection member PB may improve the light transmittance of the component area CA. The panel protective member PB may include polyethylene terephthalate (PET) or polyimide (PI).

The component area CA may have a larger area (e.g., in a plan view) than an area where the component 40 is arranged. Accordingly, an area of the opening PB_OP in the panel protective member PB may not be equal to that of the component area CA.

Also, a plurality of components 40 may be at (e.g., in or on) the component area CA. The plurality of components 40 may have different functions from one another. For example, the plurality of components 40 may include at least two from among a camera (e.g., an imaging device), a solar battery, a flash, a proximity sensor, an illuminance sensor, and an iris sensor.

In FIG. 2A, a bottom metal layer BML is not arranged under (e.g., underneath) the auxiliary light-emitting device EDa of the component area CA, but in some embodiments, as shown in FIG. 2B, the display apparatus 1 may include the bottom metal layer BML.

The bottom metal layer BML may be between the substrate 100 and the auxiliary light-emitting device EDa to overlap with the auxiliary light-emitting device EDa. The bottom metal layer BML may block or substantially block the external light from reaching the auxiliary light-emitting device EDa. In some embodiments, the bottom metal layer BML may entirely correspond to the component area CA, and may include a lower hole corresponding to the transmission area TA. In this case, the lower hole may be provided in various suitable shapes, for example, such as a polygonal shape, a circular shape, or a non-defined shape, so as to adjust a refractive characteristic of the external light.

Figure 3:
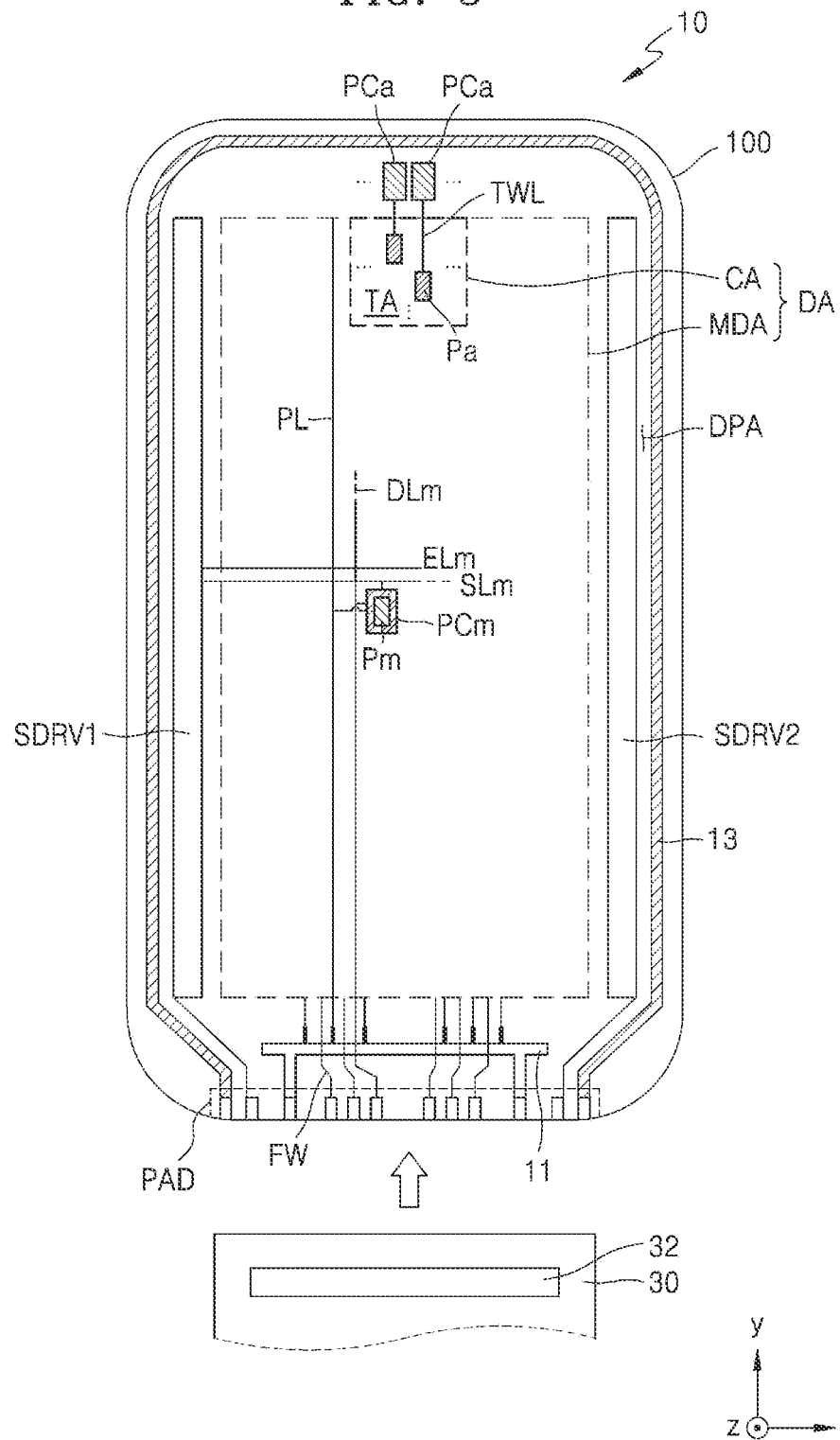
FIG. 3 is a plan view of a display panel that may be included in the display apparatus of FIG. 1.

FIG. 3 is a plan view of the display panel 10 that may be included in the display apparatus 1 of FIG. 1.

Referring to FIG. 3, various elements of the display panel 10 are on the substrate 100. The substrate 100 includes the display area DA, and the peripheral area DPA surrounding (e.g., around a periphery of) the display area DA. The display area DA includes the main display area MDA for displaying a main image, and the component area CA for displaying an auxiliary image and having the transmission area TA. The auxiliary image may form a single entire image together with the main image, or may be an image that is independent from the main image.

A plurality of main sub-pixels Pm are arranged at (e.g., in or on) the main display area MDA. Each of the plurality of main sub-pixels Pm may be implemented as a display element, for example, such as an organic light-emitting diode OLED. The main pixel circuit PCm for driving the main sub-pixel Pm is at (e.g., in or on) the main display area MDA, and the main pixel circuit PCm may overlap with the main sub-pixel Pm. Each of the plurality of main subpixels Pm may emit, for example, a red light, a green light, a blue light, or a white light. The main display area MDA may be covered with an encapsulation member, and thus, may be protected from ambient air, moisture, and/or the like.

The component area CA may be at a side of the main display area MDA as described above, or may be in the display area DA to be surrounded (e.g., around a periphery thereof) by the main display area MDA. A plurality of auxiliary sub-pixels Pa are arranged at (e.g., in or on) the component area CA. Each of the auxiliary sub-pixels Pa may include a display element, for example, such as an organic light-emitting diode OLED. The auxiliary pixel circuit PCa for driving the auxiliary sub-pixel Pa may be at (e.g., in or on) the peripheral area DPA that is adjacent to the component area CA. For example, when the component area CA is at (e.g., in or on) an upper side of the display area DA, the auxiliary pixel circuit PCa may be at (e.g., in or on) the upper side of the peripheral area DPA. The display element included in the auxiliary sub-pixel Pa and the auxiliary pixel circuit PCa may be connected to each other via the connecting line TWL extending in the y-direction.

Each of the plurality of auxiliary subpixels Pa may emit, for example, a red light, a green light, a blue light, or a white light. The component area CA may be covered with an encapsulation member, and thus, may be protected from ambient air, moisture, and/or the like.

In addition, the component area CA may include the transmission area TA. The transmission areas TA may be arranged to surround (e.g., around a periphery of) the plurality of auxiliary subpixels Pa. As another example, the transmission areas TA may be arranged in a lattice configuration, together with the plurality of auxiliary subpixels Pa.

Because the component area CA has the transmission areas TA, a resolution of the component area CA may be lower than a resolution of the main display area MDA. For example, the resolution of the component area CA may be about ½, ⅜, ⅓, ¼, ⅖, ⅛, ⅑, or 1/16 of the resolution of the main display area MDA. For example, the resolution of the main display area MDA may be about 400 ppi or greater, and the resolution of the component area CA may be about 200 ppi or about 100 ppi.

Pixel circuits that drive the main and auxiliary subpixels Pm and Pa may be electrically connected to outer circuits that are arranged at (e.g., in or on) the peripheral area DPA. A first scan driving circuit SDRV1, a second scan driving circuit SDRV2, a terminal portion PAD, a driving voltage supply line 11, and a common voltage supply line 13 may be at (e.g., in or on) the peripheral area DPA.

The first scan driving circuit SDRV1 may apply a scan signal to each of the main pixel circuits PCm that drive the main sub-pixels Pm via a corresponding main scan line SLm. The first scan driving circuit SDRV1 may apply an emission control signal to each of the pixel circuits PCm via a corresponding main emission control line ELm. The second scan driving circuit SDRV2 may be opposite to the first scan driving circuit SDRV1 based on the main display area MDA, and may be in parallel with the first scan driving circuit SDRV1. Some of the pixel circuits of the main sub-pixels Pm at (e.g., in or on) the main display area MDA may be electrically connected to the first scan driving circuit SDRV1, and the other pixel circuits of the main sub-pixels Pm may be electrically connected to the second scan driving circuit SDRV2.

The terminal portion PAD may be at a side of the substrate 100. The terminal portion PAD is not covered by an insulating layer, and is exposed to be connected to a display circuit board 30. A display driver 32 may be on the display circuit board 30.

The display driver 32 may generate control signals that are to be transferred to the first scan driving circuit SDRV1 and the second scan driving circuit SDRV2. The display driver 32 may generate a data signal, and the data signal may be transferred to the main pixel circuits PCm via a fan-out wire FW and a main data line DLm connected to the fan-out wire FW.

Also, the display driver 32 may supply a driving voltage ELVDD to the driving voltage supply line 11, and may supply a common voltage ELVSS to the common voltage supply line 13. The driving voltage ELVDD may be applied to the pixel circuits of the main and auxiliary sub-pixels Pm and Pa via the driving voltage line PL connected to the driving voltage supply line 11, and the common voltage ELVSS may be applied to an opposite electrode of the display elements via the common voltage supply line 13.

The driving voltage supply line 11 may extend in the x-direction below the main display area MDA. The common voltage supply line 13 may have a loop shape of which one side is open, and may surround (e.g., around a periphery of) a portion of the main display area MDA.

FIG. 3 shows one component area CA, but the present disclosure is not limited thereto, and a plurality of component areas CA may be provided. In this case, the plurality of component areas CA may be spaced apart (e.g., may be separated) from one another, a first camera may correspond to one component area CA, and a second camera may correspond to another component area CA. As another example, a camera may correspond to one component area CA, and an infrared ray sensor may correspond to another component area CA. The shapes and/or sizes of the plurality of component areas CA may be different from one another.

The component area CA may have a circular shape, an elliptical shape, a polygonal shape, or a non-defined shape. In some embodiments, the component area CA may have an octagonal shape. The component area CA may have various suitable polygonal shapes, for example, such as a rectangular shape, a hexagonal shape, and/or the like. The component area CA may be surrounded (e.g., around a periphery thereof) by the main display area MDA.

Figure 4A:
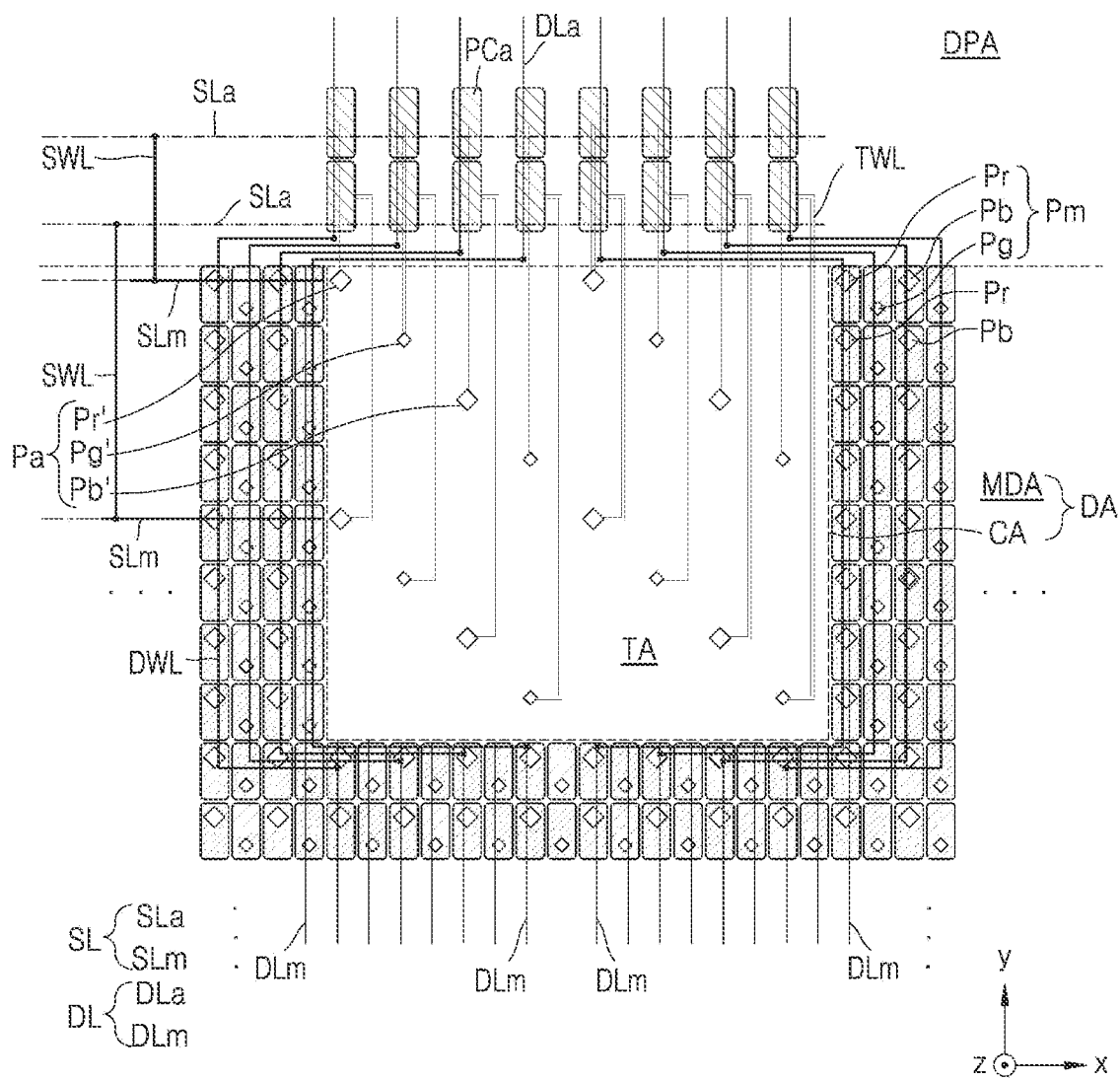
FIG. 4A is a plan layout showing a partial area of a display panel according to an embodiment.
Figure 4B:
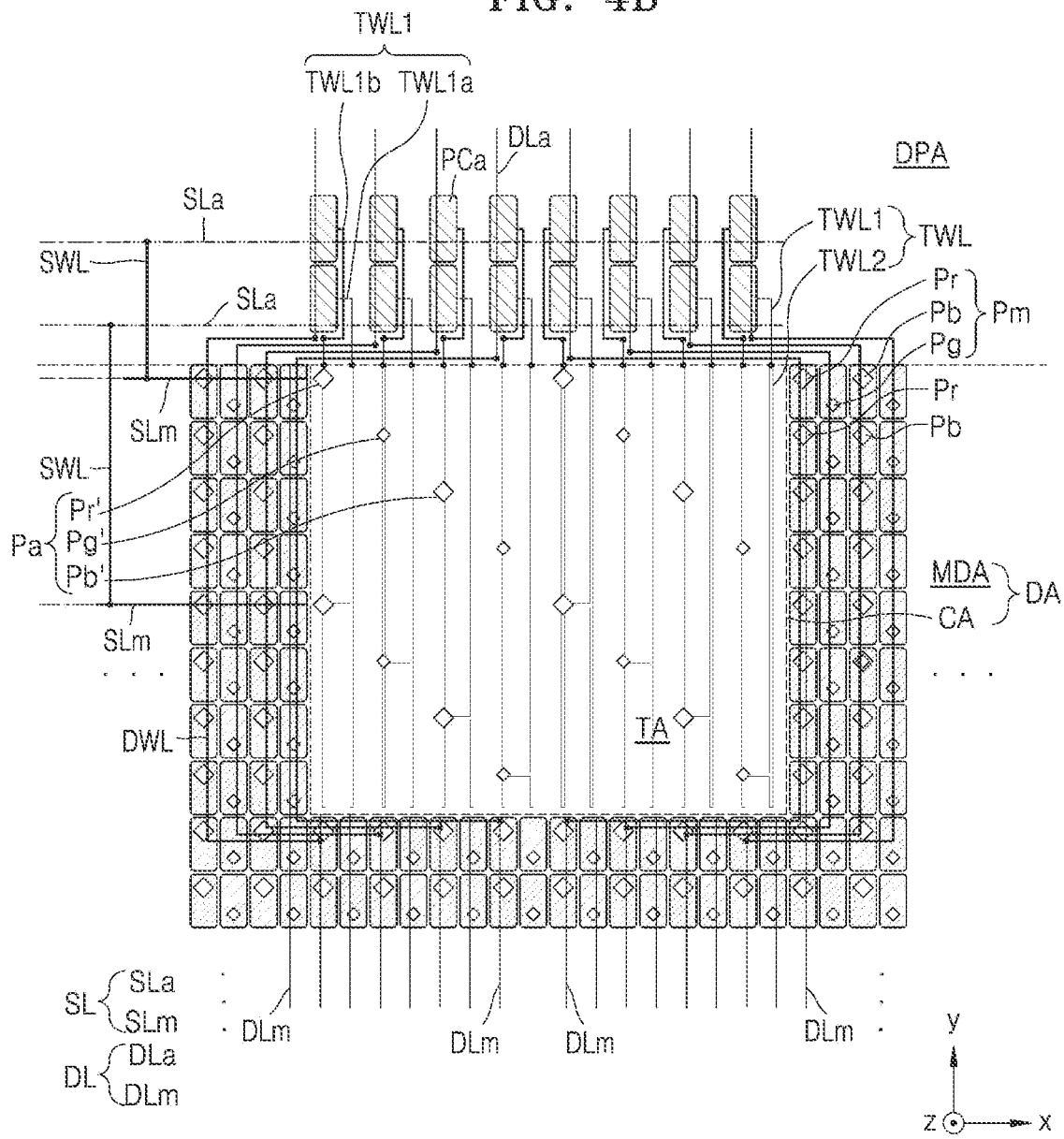
FIG. 4B is a plan layout showing a partial area of a display panel according to an embodiment.

FIGS. 4A and 4B are planar layouts showing some regions of the display panel 10 according to one or more embodiments. In more detail, FIGS. 4A and 4B each shows the component area CA, the main display area MDA around (e.g., adjacent to or surrounding) the component area CA, and a part (e.g., a portion) of the peripheral area DPA.

Referring to FIG. 4A, a plurality of main sub-pixels Pm may be at (e.g., in or on) the main display area MDA. As used in the present specification, a sub-pixel is a minimum unit for realizing an image, and denotes a light-emitting region from which light is emitted by a display element. When an organic light-emitting diode is used as the display element, the light-emitting region may be defined by an opening of a pixel defining layer. This will be described in more detail below. Each of the plurality of main sub-pixels Pm may emit one of a red light, a green light, a blue light, and a white light.

In some embodiments, the main sub-pixels Pm at (e.g., in or on) the main display area MDA may include a first sub-pixel Pr, a second sub-pixel Pg, and a third sub-pixel Pb. The first sub-pixel Pr, the second sub-pixel Pg, and the third sub-pixel Pb may emit red light, green light, and blue light, respectively. The main sub-pixels Pm may be arranged in an RGBG type structure (e.g., in a PENTILE® structure, PENTILE® being a duly registered trademark of Samsung Display Co., Ltd.).

For example, from among vertices of a virtual square having a central point of the second sub-pixel Pg as a central point of the square, the first sub-pixel Pr may be located at first and third vertices of the virtual square, and the third sub-pixel Pb may be located at second and fourth vertices of the virtual square. A size (e.g., an area) of the second sub-pixel Pg may be less than (e.g., may be smaller than) those of the first sub-pixel Pr and the third sub-pixel Pb.

This pixel arrangement structure may be referred to as an RGBG matrix structure or an RGBG structure (e.g., a PENTILE® matrix structure or a PENTILE® structure). By applying rendering, in which a color of a pixel is represented by sharing the colors of its adjacent pixels, a high resolution image may be obtained via a smaller number of pixels.

FIG. 4A shows that the plurality of main sub-pixels Pm are arranged in the RGBG matrix structure (e.g., the PENTILE® matrix structure), but the present disclosure is not limited thereto. For example, the plurality of main sub-pixels Pm may be arranged in various suitable shapes and structures, for example, such as a stripe structure, a mosaic arrangement structure, a delta arrangement structure, or the like.

In the main display area MDA, the main pixel circuits PCm may overlap with the main sub-pixels Pm, and the main pixel circuits PCm may be arranged in the form of a matrix in the x and y directions. As used in the specification, the main pixel circuit PCm denotes a unit of a pixel circuit included in one main sub-pixel Pm.

A plurality of auxiliary sub-pixels Pa may be at (e.g., in or on) the component area CA. Each of the plurality of auxiliary sub-pixels Pa may emit one of a red light, a green light, a blue light, and a white light. The auxiliary sub-pixels Pa may include a first sub-pixel Pr', a second sub-pixel Pg', and a third sub-pixel Pb'. The first sub-pixel Pr', the second sub-pixel Pg', and the third sub-pixel Pb' may emit red light, green light, and blue light, respectively.

The number of auxiliary sub-pixels Pa per unit area at (e.g., in or on) the component area CA may be less than the number of main sub-pixels Pm per unit area at (e.g., in or on) the main display area MDA. For example, the number of the auxiliary sub-pixels Pa and the number of main sub-pixels Pm per the same unit area may be in a ratio of 1:2, 1:4, 1:8, or 1:9. In other words, a resolution of the component area CA may be ½, ¼, ⅛, or ⅑ of a resolution of the main display area MDA. In FIG. 4A, the resolution of the component area CA is shown to be ⅛ of the resolution of the main display area MDA.

The auxiliary sub-pixels Pa at (e.g., in or on) the component area CA may be arranged in various suitable shapes. Some of the auxiliary sub-pixels Pa may be grouped as a pixel group, and in the pixel group, the auxiliary sub-pixels Pa may be arranged in various suitable shapes, for example, such as a stripe structure, a mosaic arrangement structure, a delta arrangement structure, or the like. A distance between the auxiliary sub-pixels Pa in the pixel group may be equal to or substantially equal to a distance between the main sub-pixels Pm.

In another example, as shown in FIG. 4A, the auxiliary sub-pixels Pa may be distributed at (e.g., in or on) the component area CA. In other words, a distance between the auxiliary sub-pixels Pa may be greater than a distance between the main sub-pixels Pm. In addition, a region where the auxiliary sub-pixels Pa are not provided at (e.g., in or on) the component area CA may be the transmission area TA having a high light transmittance.

The auxiliary pixel circuits PCa for realizing the light emission from the auxiliary sub-pixels Pa may be at (e.g., in or on) the peripheral area DPA. Because the auxiliary pixel circuits PCa are not at (e.g., in or on) the component area CA, the component area CA may have a relatively larger transmission area TA.

The auxiliary pixel circuits PCa may be connected to the auxiliary sub-pixels Pa via the connecting lines TWL. Accordingly, when a length of the connecting line TWL increases, an RC delay may occur. Thus, the auxiliary pixel circuits PCa may be arranged by taking into account the lengths of the connecting lines TWL. In some embodiments, the auxiliary pixel circuits PCa may be on extension lines that are connected to the auxiliary pixels Pa arranged in the y-direction. Also, the auxiliary pixel circuits PCa, the number of which is equal to or substantially equal to that of the auxiliary sub-pixels Pa arranged in the y-direction, may be arranged in the y-direction. For example, as shown in FIG. 4A, when two auxiliary sub-pixels Pa are arranged in the y-direction at (e.g., in or on) the component area CA, two auxiliary pixel circuits PCa may be arranged in the y-direction at (e.g., in or on) the peripheral area DPA.

The connecting line TWL may extend in the y-direction to connect the auxiliary sub-pixels Pa and the auxiliary pixel circuits PCa to each other. The connecting line TWL may include a transparent conductive material. For example, the connecting line TWL may include a transparent conducting oxide (TCO). The connecting line TWL may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO).

As used herein, the connecting line TWL is connected to the auxiliary sub-pixel Pa may denote that the connecting line TWL is electrically connected to a pixel electrode of the display element included in the auxiliary sub-pixel Pa.

The scan line SL may include a main scan line SLm connected to the main pixel circuits PCm, and an auxiliary scan line SLa connected to the auxiliary pixel circuits PCa. The main scan line SLm extends in the x-direction to be connected to the main pixel circuits PCm of a same row. The main scan line SLm may not be at (e.g., in or on) the component area CA. In other words, the main scan line SLm may be disconnected at the component area CA. In this case, the main scan line SLm at a left side of the component area CA may receive a signal from the first scan driving circuit SDRV1 (e.g., see FIG. 3), and the main scan line SLm at a right side of the component area CA may receive a signal from the second scan driving circuit SDRV2 (e.g., see FIG. 3).

The auxiliary scan line SLa may be connected to the auxiliary pixel circuits PCa that drive the auxiliary sub-pixels Pa of the same row, from among the auxiliary pixel circuits PCa of the same row.

The main scan line SLm and the auxiliary scan line SLa are connected to a scan connecting line SWL, and thus, a same or substantially the same signal may be applied to the pixel circuits for driving the main sub-pixel Pm and the auxiliary sub-pixel Pa of the same row.

The scan connecting line SWL may be at a different layer from those of the main scan line SLm and the auxiliary scan line SLa, and thus, the scan connecting line SWL may be connected to the main scan line SLm and the auxiliary scan line SLa via contact holes, respectively. The scan connecting line SWL may be at (e.g., in or on) the peripheral area DPA.

The data line DL may include a main data line DLm connected to the main pixel circuits PCm, and an auxiliary data line DLa connected to the auxiliary pixel circuits PCa. The main data line DLm extends in the y-direction, and may be connected to the main pixel circuits PCm of a same column. The auxiliary data line DLa extends in the y-direction, and may be connected to the auxiliary pixel circuits PCa of a same column.

The main data line DLm and the auxiliary data line DLa may be spaced apart (e.g., may be separated) from each other with the component area CA therebetween. The main data line DLm and the auxiliary data line DLa are connected to a data connecting line DWL, and thus, a same or substantially the same signal may be applied to the pixel circuits for driving the main sub-pixel Pm and the auxiliary sub-pixel Pa of the same column.

The data connecting line DWL may bypass (e.g., may extend around) the component area CA. The data connecting line DWL may overlap with the main pixel circuits PCm at (e.g., in or on) the main display area MDA. Because the data connecting line DWL is at (e.g., in or on) the main display area MDA, an additional space for arranging the data connecting line DWL may not be used or may be reduced, and thus, an area of a dead space may be reduced.

The data connecting line DWL may be at a different layer from those of the main data line DLm and the auxiliary data line DLa, and thus, the data connecting line DWL may be connected to the main data line DLm and the auxiliary data line DLa via contact holes, respectively.

FIG. 4A shows that the connecting line TWL is integrally provided from the peripheral area DPA to the auxiliary sub-pixels Pa at (e.g., in or on) the component area CA, but the present disclosure is not limited thereto. For example, as shown in FIG. 4B, the connecting line TWL may include a first connecting line TWL1 and a second connecting line TWL2, and the first and second connecting lines TWL1 and TWL2 may include different materials from each other.

The first connecting line TWL1 may be at (e.g., in or on) the peripheral area DPA, and may be connected to the auxiliary pixel circuit PCa. The first connecting line TWL1 may include a conductive material including, for example, molybdenum (Mo), aluminum (Al), copper (Cu), titanium (Ti), and/or the like, and may have a single-layer structure or a multi-layered structure. A plurality of first connecting lines TWL1 may be arranged among the auxiliary pixel circuits PCa. In some embodiments, the first connecting line TWL1 may include a 1-1st connecting line TWL1a and a 1-2nd connecting line TWL1b at different layers from each other. For example, the 1-1st connecting line TWL1a may be at the same layer as that of the data line DL, and may include the same or substantially the same material as that of the data line DL. The 1-2nd connecting line TWL1b and the 1-1st connecting line TWL1a may be arranged with an insulating layer therebetween. For example, the 1-2nd connecting line TWL1b may be at the same layer as that of a pixel electrode 121 (e.g., see FIG. 11) of the organic light-emitting diode OLED, and may include the same or substantially the same material as that of the pixel electrode 121. As another example, the 1-2nd connecting line TWL1b may be at the same layer as that of a connecting electrode CM (e.g., see FIG. 11), and may include the same or substantially the same material as that of the connecting electrode CM. The 1-1st connecting line TWL1a and the 1-2nd connecting line TWL1b may be arranged between the auxiliary pixel circuits PCa, and may be at least partially curved on a plane. A plurality of 1-1st connecting lines TWL1a and a plurality of 1-2nd connecting lines TWL1b may be provided at different layers from each other, and the 1-1st connecting line TWL1a and the 1-2nd connecting line TWL1b may be alternately arranged at (e.g., in or on) regions among the plurality of pixel circuits PCa.

The second connecting line TWL2 is at (e.g., in or on) the component area CA, and may be connected to the first connecting line TWL1 at an edge of the component area CA. The second connecting line TWL2 may include a transparent conductive material. For example, the second connecting line TWL2 may include a transparent conducting oxide (TCO). The second connecting line TWL2 may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO).

The first connecting line TWL1 and the second connecting line TWL2 may be at the same layer as each other, or may be at different layers from each other. When the first connecting line TWL1 and the second connecting line TWL2 are at different layers from each other, the first and second connecting lines TWL1 and TWL2 may be connected to each other via a contact hole.

The first connecting line TWL1 may have a higher conductivity than that of the second connecting line TWL2. Because the first connecting line TWL1 is at (e.g., in or on) the peripheral area DPA, there may be no need to ensure light transmittance therethrough. Thus, the first connecting line TWL1 may include a material having a lower light transmittance and a higher conductivity than that of the second connecting line TWL2. Accordingly, a resistance of the connecting line TWL may be reduced.

In addition, the plurality of second connecting lines TWL2 may have the same or substantially the same lengths as each other. For example, ends of the plurality of second connecting lines TWL2 may extend to a boundary of the component area CA opposite to the auxiliary pixel circuits PCa. This may be to match the electric load caused by the second connecting line TWL2. Accordingly, a luminance variation in the component area CA may be reduced. The number of the second connecting lines TWL2 at (e.g., in or on) the component area CA may be equal to or substantially equal to that of the auxiliary pixel circuits PCa.

Figure 5:
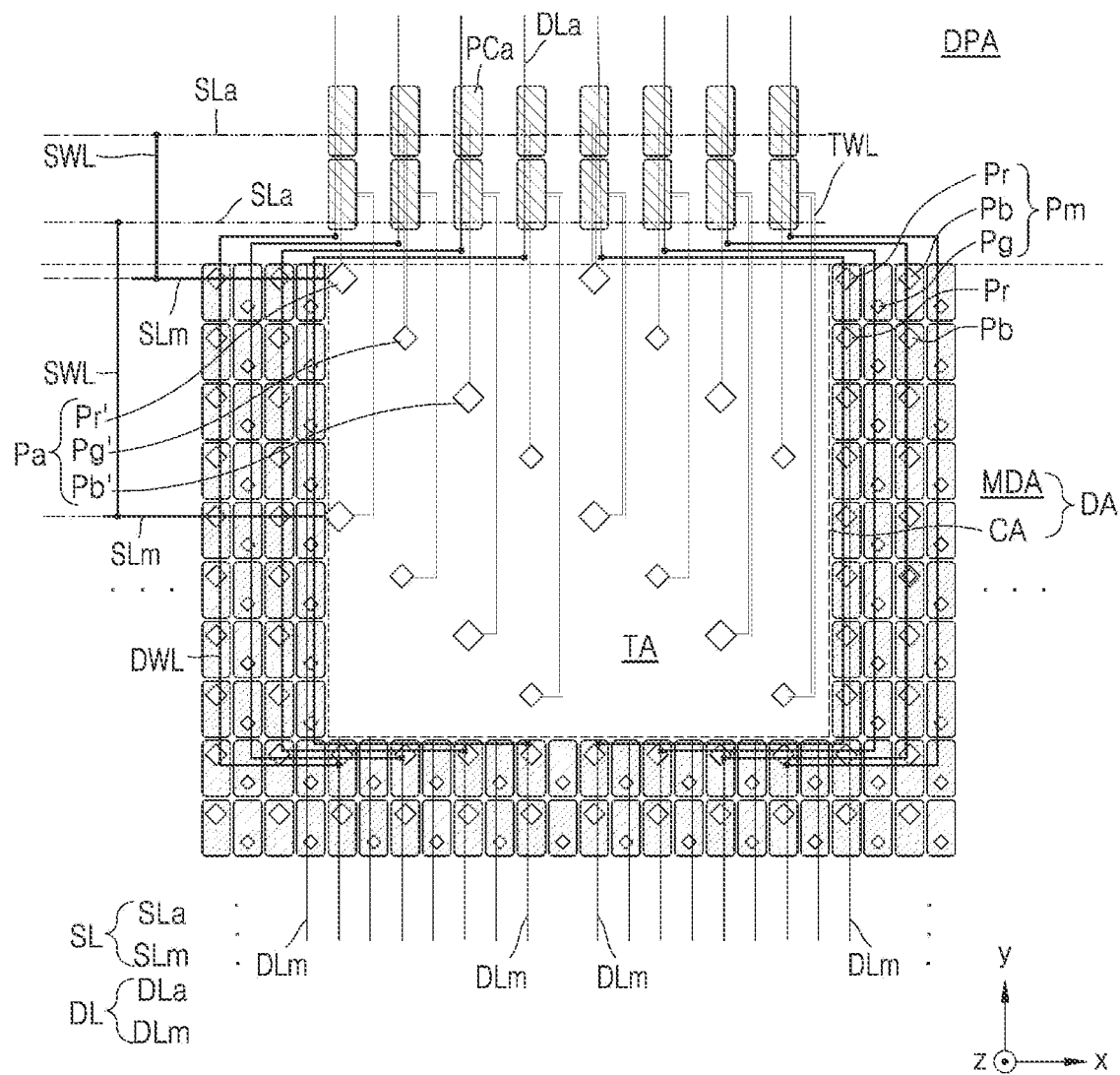
FIG. 5 is a plan layout showing a partial area of a display panel according to an embodiment.

FIG. 5 is a plan layout showing a portion of the display panel according to an embodiment. In FIG. 5, the same reference numerals as those of FIG. 4A are used to denote the same or substantially the same elements, members, or layers, and thus, redundant description thereof may not be repeated.

Referring to FIG. 5, a size of the auxiliary sub-pixel Pa may be greater than (e.g., may be larger than) that of the main sub-pixel Pm that emits the same color. For example, the first sub-pixel Pr' from among the auxiliary sub-pixels Pa for emitting red light may have a greater size than that of the first sub-pixel Pr from among the main sub-pixels Pm for emitting red light. The second sub-pixel Pg' from among the auxiliary sub-pixels Pa for emitting green light may have a greater size than that of the second sub-pixel Pg from among the main sub-pixels Pm for emitting green light. The third sub-pixel Pb' from among the auxiliary sub-pixels Pa for emitting blue light may have a greater size than that of the third sub-pixel Pb from among the main sub-pixels Pm for emitting blue light. The size differences thereof may be designed by taking into account a difference between luminances and/or resolutions of the component area CA and the main display area MDA.

Figure 6:
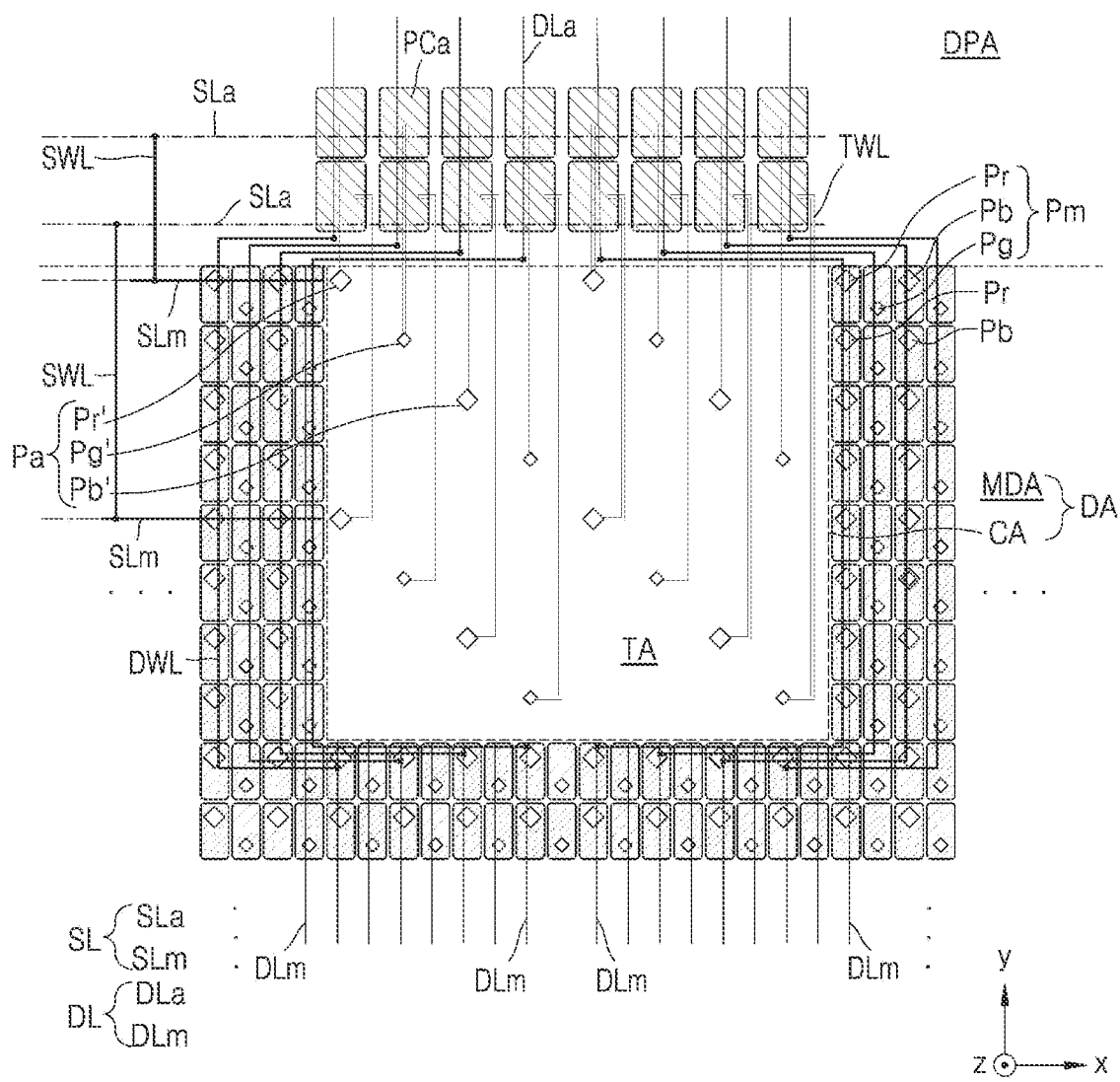
FIG. 6 is a plan layout showing a partial area of a display panel according to an embodiment.

FIG. 6 is a plan layout showing a portion of the display panel according to an embodiment. In FIG. 6, the same reference numerals as those of FIG. 4A are used to denote the same or substantially the same elements, members, or layers, and thus, redundant description thereof may not be repeated.

Referring to FIG. 6, an area occupied by one auxiliary pixel circuit PCa may be greater than an area occupied by one main pixel circuit PCm. A resolution of the component area CA is less than that of the main display area MDA, and thus, the number of auxiliary pixel circuits PCa for driving the auxiliary sub-pixels Pa at (e.g., in or on) the component area CA per unit area may be less than the number of the main pixel circuits PCm per unit area.

Accordingly, there may be an available space between the auxiliary pixel circuits PCa, and a capacity of a storage capacitor included in each of the auxiliary pixel circuits PCa may be increased. This may denote that a light emission luminance range of the auxiliary sub-pixel Pa may be increased, and that the light emission luminance may be finely adjusted. As another example, the auxiliary pixel circuit PCa may be modified as needed or desired, such that a difference in image quality between the component area CA and the main display area MDA may be reduced.

Figure 7:
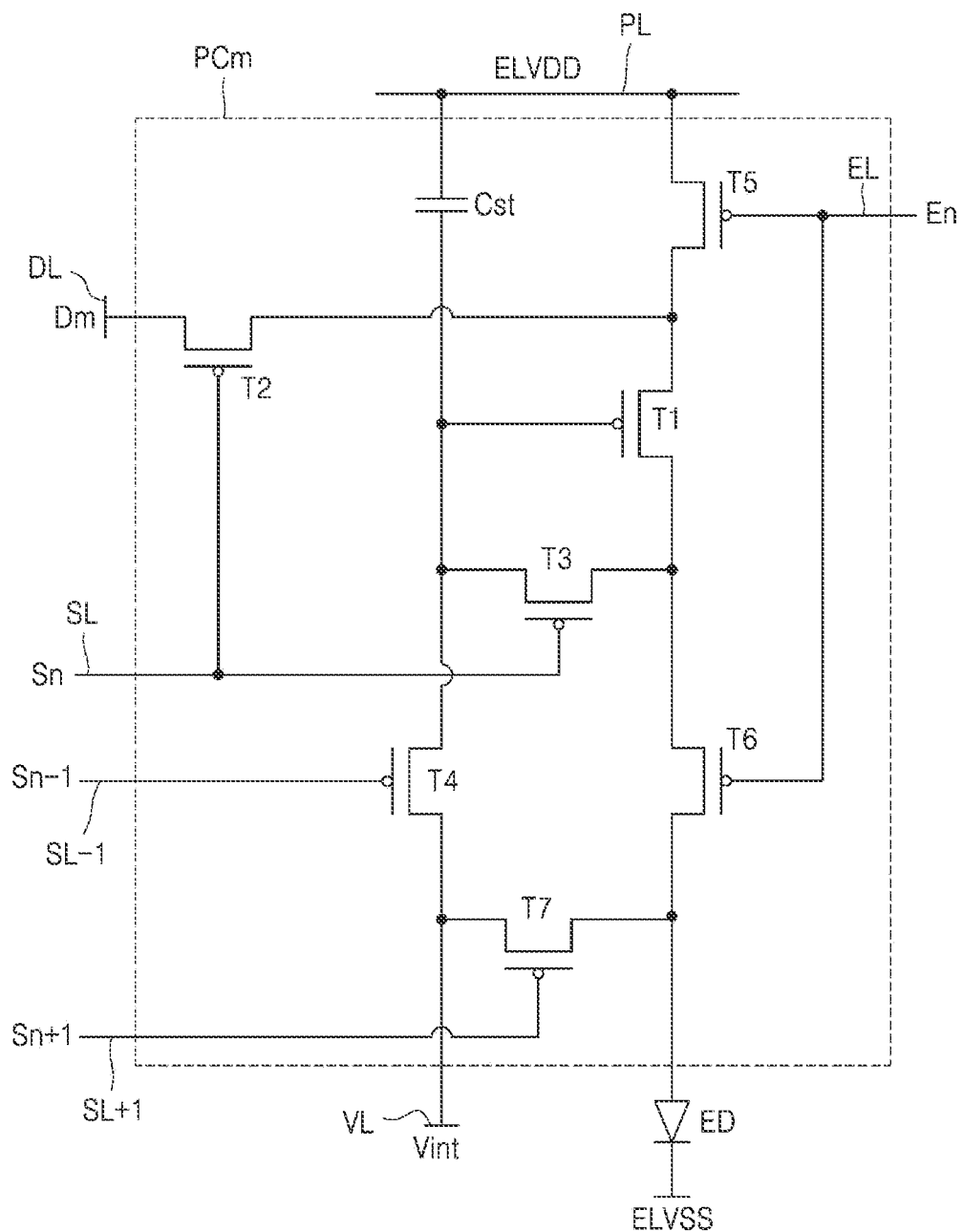
FIG. 7 is an equivalent circuit diagram of a main pixel circuit for driving a main sub-pixel according to an embodiment.

FIG. 7 is an equivalent circuit diagram of the main pixel circuit PCm for driving the main sub-pixel Pm according to an embodiment.

Referring to FIG. 7, the main pixel circuit PCm may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a main storage capacitor Cst.

In FIG. 5, the main pixel circuit PCm is shown as being connected to signal lines SL, SL−1, SL+1, EL, DL, an initialization voltage line VL, and the driving voltage line PL, but the present disclosure is not limited thereto. According to another embodiment, at least one of the signal lines, for example, the scan line SL, the previous scan line SL−1, the next scan line SL+1, the light-emission control line EL, and the data line DL, and/or the initializing voltage line VL may be shared by neighboring pixel circuits (e.g., by adjacent pixel circuits).

A drain electrode of the driving thin film transistor T1 may be electrically connected to a main light-emitting device ED via the emission control thin film transistor T6. The driving thin film transistor T1 receives the data signal Dm according to a switching operation of the switching thin film transistor T2 to supply a driving current to the main light-emitting device ED.

A gate electrode of the switching thin film transistor T2 is connected to the scan line SL, and a source electrode of the switching thin film transistor T2 is connected to the data line DL. A drain electrode of the switching thin-film transistor T2 may be connected to a source electrode of the driving thin-film transistor T1, and may be connected to the driving voltage line PL via the operation control thin-film transistor T5.

The switching thin-film transistor T2 is turned on according to the scan signal Sn received via the scan line SL, and performs a switching operation to transmit the data signal Dm received from the data line DL to the source electrode of the driving thin-film transistor T1.

A gate electrode of the compensation thin-film transistor T3 may be connected to the scan line SL. A source electrode of the compensating thin-film transistor T3 may be connected to the drain electrode of the driving thin-film transistor T1, and may be connected to a pixel electrode of the light-emitting device ED via the light-emission control thin-film transistor T6. A drain electrode of the compensating thin film transistor T3 may be connected to one electrode of the main storage capacitor Cst, together with a source electrode of the first initialization thin film transistor T4 and the gate electrode of the driving thin film transistor T1. The compensating thin film transistor T3 is turned on according to the scan signal Sn received via the scan line SL, and connects the gate electrode and the drain electrode of the driving thin film transistor T1 to each other. Thus, the compensating thin film transistor T3 may diode-connect the driving thin film transistor T1.

A gate electrode of the first initialization thin film transistor T4 may be connected to the previous scan line SL−1. A drain electrode of the first initialization thin film transistor T4 may be connected to the initialization voltage line VL. The source electrode of the first initialization thin film transistor T4 may be connected to the one electrode of the main storage capacitor Cst, together with the drain electrode of the compensating thin film transistor T3 and the gate electrode of the driving thin film transistor T1. The first initialization thin film transistor T4 is turned on according to a scan signal Sn−1 transferred through the previous scan line SL−1 to transfer an initialization voltage Vint to the gate electrode of the driving thin film transistor T1, and performs an initialization operation for initializing a voltage at the gate electrode of the driving thin film transistor T1.

A gate electrode of the operation control thin film transistor T5 may be connected to the emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin film transistor T6 may be electrically connected to the pixel electrode of the main light-emitting device ED. The operation control thin film transistor T5 and the emission control thin film transistor T6 are concurrently turned on (e.g., are simultaneously turned on) according to an emission control signal En transferred through the emission control line EL to transfer the driving voltage ELVDD to the main light-emitting device ED, and the driving current flows through the light-emitting device ED.

A gate electrode of the second initialization thin film transistor T7 may be connected to a post scan line (e.g., a next scan line) SL+1. A source electrode of the second initialization thin film transistor T7 may be connected to the pixel electrode of the light-emitting device ED. A drain electrode of the second initialization thin film transistor T7 may be connected to the initialization voltage line VL. The second initializing thin-film transistor T7 may be turned on according to a next scan signal Sn+1 received via the next scan line SL+1, and may initialize the pixel electrode of the light-emitting device ED.

FIG. 7 shows an example in which the first initialization thin film transistor T4 and the second initialization thin film transistor T7 are connected to the previous scan line SL−1 and the next scan line SL+1, respectively, but the present disclosure is not limited thereto. In another embodiment, the first initialization thin film transistor T4 and the second initialization thin film transistor T7 may both be connected to a previous scan line SL−1 to be operated according to the previous scan signal Sn−1.

Another electrode of the main storage capacitor Cst may be connected to the driving voltage line PL. The one electrode of the main storage capacitor Cst may be connected to the gate electrode of the driving thin film transistor T1, the drain electrode of the compensating thin film transistor T3, and the source electrode of the first initialization thin film transistor T4.

An opposite electrode (e.g., a cathode) of the main light-emitting device ED may receive the common voltage ELVSS. The light-emitting device ED receives the driving current from the driving thin-film transistor T1, and emits light.

The main pixel circuit PCm is not limited to the number and/or circuit design of the thin film transistors and the storage capacitor illustrated with reference to FIG. 7, and the number and/or the circuit design thereof may be variously modified.

Figure 8:
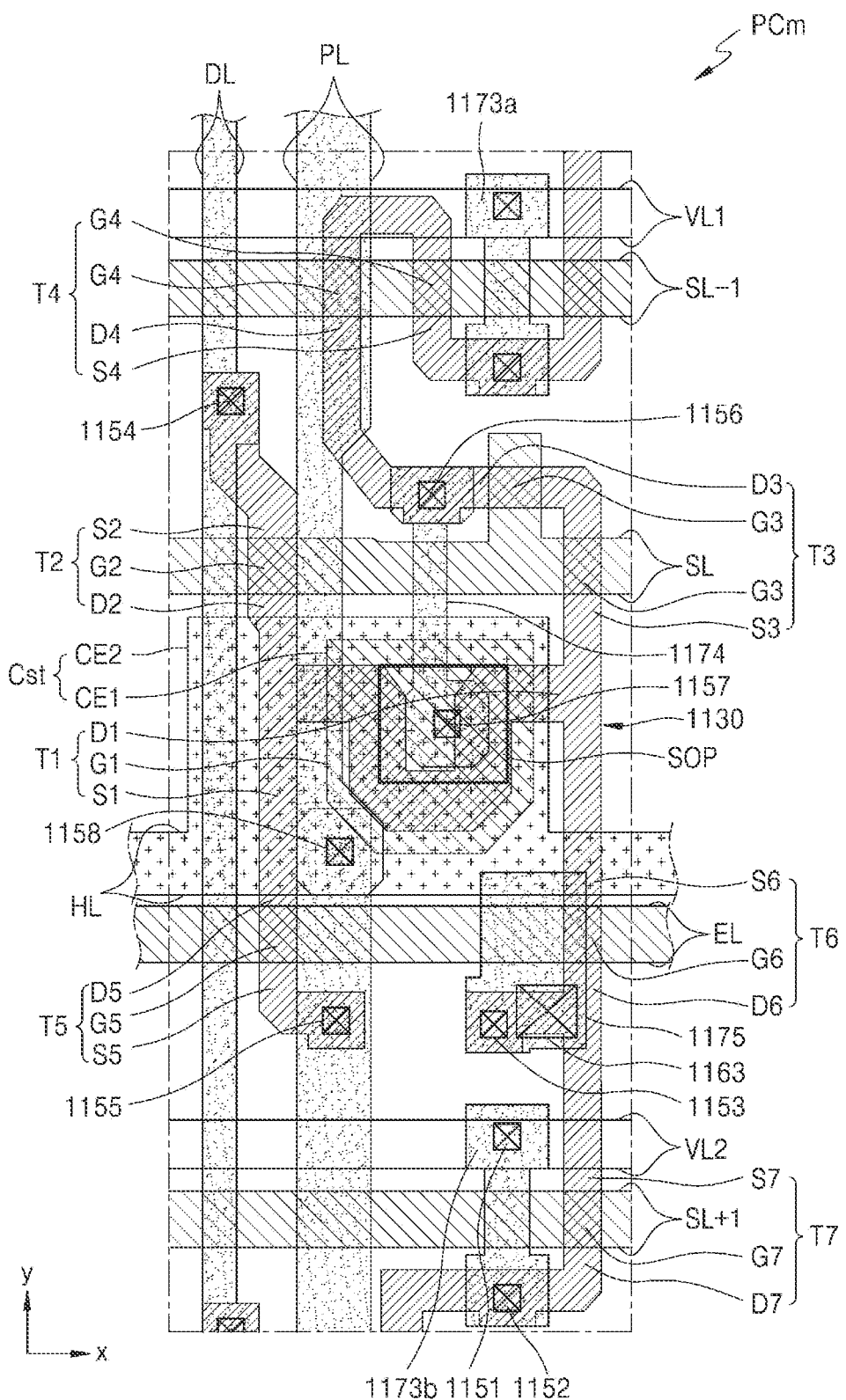
FIG. 8 is a plan view of a main pixel circuit according to an embodiment.

FIG. 8 is a plan view of a main pixel circuit according to an embodiment.

Referring to FIG. 8, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130. The semiconductor layer 1130 is arranged on a substrate on which a buffer layer including an inorganic insulating material is arranged.

Some regions of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are connected to one another, and are curved (e.g., are bent) in various suitable shapes.

The semiconductor layer 1130 includes a channel region, and a source region and a drain region at opposite sides of the channel region. The source region and the drain region may be appreciated as a source electrode and a drain electrode, respectively, of a corresponding thin film transistor. Hereinafter, the source region and the drain region will be referred to as a source electrode and a drain electrode, for convenience of description.

The driving thin film transistor T1 includes the driving gate electrode G1 overlapping with a driving channel region, and the driving source electrode S1 and the driving drain electrode D1 at opposite sides of the driving channel region. The driving channel region overlapping with the driving gate electrode G1 has a bent shape, for example, such as an omega shape, to establish a long channel length within a narrow space. When the driving channel region has a long length, a driving range of a gate voltage increases, and thus, a gray level of light emitted from the organic light-emitting diode OLED that is the light-emitting device ED may be finely controlled, and quality of displaying an image may be improved.

The switching thin film transistor T2 includes the switching gate electrode G2 overlapping with a switching channel region, and the switching source electrode S2 and the switching drain electrode D2 at opposite sides of the switching channel region. The switching drain electrode D2 may be connected to the driving source electrode S1. The compensation thin film transistor T3 may be a dual-thin film transistor including compensation gate electrodes G3 overlapping with two compensation channel regions, respectively, and a compensation source electrode S3 and a compensation drain electrode D3 at opposite sides of the two compensation channel regions. The compensation thin film transistor T3 may be connected to the driving gate electrode G1 of the driving thin film transistor T1 via a node connecting line 1174 that will be described in more detail below.

The first initialization thin film transistor T4 may be a dual-thin film transistor including first initialization gate electrodes G4 overlapping with two first initialization channel regions, respectively, and a first initialization source electrode S4 and a first initialization drain electrode D4 at opposite sides of the two first initialization channel regions.

The operation control thin film transistor T5 may include an operation control gate electrode G5 overlapping with an operation control channel region, and the operation control source electrode S5 and the operation control drain electrode D5 at opposite sides of the operation control gate electrode G5. The operation control drain electrode D5 may be connected to the driving source electrode S1.

The emission control thin film transistor T6 may include the emission control gate electrode G6 overlapping with an emission control channel region, and the emission control source electrode S6 and the emission control drain electrode D6 at opposite sides of the emission control gate electrode G6. The emission control source electrode S6 may be connected to the driving drain electrode D1.

The second initialization thin film transistor T7 may include the second initialization gate electrode G7 overlapping with a second initialization channel region, and the second initialization source electrode S7 and the second initialization drain electrode D7 at opposite sides of the second initialization gate electrode G7.

The above described thin film transistors may be connected to the signal lines SL, SL−1, SL+1, EL, and DL, first and second initialization voltage lines VL1 and VL2, and the driving voltage line PL.

The scan line SL, the previous scan line SL−1, the emission control line EL, and the driving gate electrode G1 may be arranged on the semiconductor layer 1130 with one or more insulating layer(s) therebetween.

The scan line SL may extend in the x-direction. Some regions of the scan line SL may correspond to the switching and compensation gate electrodes G2 and G3. For example, the regions of the scan line SL that overlap with the channel regions of the switching and compensation thin film transistors T2 and T3 may be the switching and compensation gate electrodes G2 and G3, respectively.

The previous scan line SL−1 extends in the x-direction, and some regions thereof may correspond to the first initialization gate electrodes G4, respectively. For example, the regions of the previous scan line SL−1 overlapping with the channel regions of the first initialization driving thin film transistor T4 may be the first initialization gate electrodes G4, respectively.

The post scan line SL+1 extends in the x-direction, and a region thereof may correspond to the second initialization gate electrode G7. For example, the region of the post scan line SL+1 overlapping with the channel region of the second initialization driving thin film transistor T7 may be the second initialization gate electrode G7.

The emission control line EL extends in the x-direction. Some regions of the emission control line EL may correspond to the operation control and emission control gate electrodes G5 and G6. For example, the regions of the emission control line EL overlapping with the channel regions of the operation control and emission control thin film transistors T5 and T6 may be the operation control and emission control gate electrodes G5 and G6, respectively.

The driving gate electrode G1 is a floating electrode that may be connected to the compensation thin film transistor T3 via the node connecting line 1174.

An electrode voltage line HL may be on the previous scan line SL−1, the scan line SL, the post scan line SL+1, the emission control line EL, and the driving gate electrode G1 with one or more insulating layer(s) therebetween.

The electrode voltage line HL may extend in the x-direction to cross with the data line DL and the driving voltage line PL. A part of the electrode voltage line HL covers at least a part of the driving gate electrode G1, and may configure the main storage capacitor Cst with the driving gate electrode G1. For example, the driving gate electrode G1 may become the lower electrode CE1 of the main storage capacitor Cst, and a part of the electrode voltage line HL may become the upper electrode CE2 of the main storage capacitor Cst.

The upper electrode CE2 of the main storage capacitor Cst is electrically connected to the driving voltage line PL. For example, the electrode voltage line HL may be connected to the driving voltage line PL disposed on the electrode voltage line HL via a contact hole 1158. Therefore, the electrode voltage line HL may have the same or substantially the same voltage level (e.g., a constant or substantially constant voltage) as that of the driving voltage line PL. For example, the electrode voltage line HL may have a constant or substantially constant voltage of +5V. The electrode voltage line HL may be appreciated as the driving voltage line PL in a transverse direction.

The driving voltage line PL extends in the y-direction, and the electrode voltage line HL that is electrically connected to the driving voltage line PL extends in the x-direction that crosses the y-direction, and thus, the plurality of driving voltage lines PL and the electrode voltage lines HL may form a mesh structure at (e.g., in or on) the display area DA.

The data line DL, the driving voltage line PL, first and second initialization connecting lines 1173a and 1173b, and the node connecting line 1174 may be arranged on the electrode voltage line HL with one or more insulating layer(s) therebetween.

The data line DL extends in the y-direction, and may be connected to the switching source electrode S2 of the switching thin film transistor T2 via a contact hole 1154. A part of the data line DL may be appreciated as the switching source electrode S2.

The driving voltage line PL extends in the y-direction, and as described above, is connected to the electrode voltage line HL via the contact hole 1158. Also, the driving voltage line PL may be connected to the operation control thin film transistor T5 via a contact hole 1155. The driving voltage line PL may be connected to the operation control source electrode S5 via the contact hole 1155.

The first initialization voltage line VL1 is connected to the first initialization thin film transistor T4 via the first initialization connecting line 1173a, and the second initialization voltage line VL2 may be connected to the second initialization thin film transistor T7 via the second initialization connecting line 1173b. In addition, the first initialization voltage line VL1 and the second initialization voltage line VL2 are electrically connected to each other via a connecting member, and may have a constant or substantially constant voltage (e.g., −2V or the like)

One end of the node connecting line 1174 may be connected to the compensation drain electrode D3 through a contact hole 1156, and another end (e.g., an opposite end) thereof may be connected to the driving gate electrode G1 through a contact hole 1157. The upper electrode CE2 includes a storage opening SOP, and the contact hole 1157 may be in the storage opening SOP.

The initialization voltage line VL may be arranged on the data line DL, the driving voltage line PL, the initialization connecting line 1173, and the node connecting line 1174 with one or more insulating layer(s) therebetween.

The first and second initialization voltage lines VL1 and VL2 are arranged at the same layer as that of a pixel electrode 121 (e.g., see FIG. 11) of the organic light-emitting diode OLED, and may include the same or substantially the same material as that of the pixel electrode 121. The pixel electrode 121 may be connected to the emission control thin film transistor T6. The pixel electrode 121 is connected to a connecting electrode CM via a contact hole 1163, and the connecting electrode CM may be connected to the emission control drain electrode D6 via the contact hole 1153. In another embodiment, the first and second initialization voltage lines VL1 and VL2 may be at the same layer as that of the electrode voltage line HL.

Figure 9:
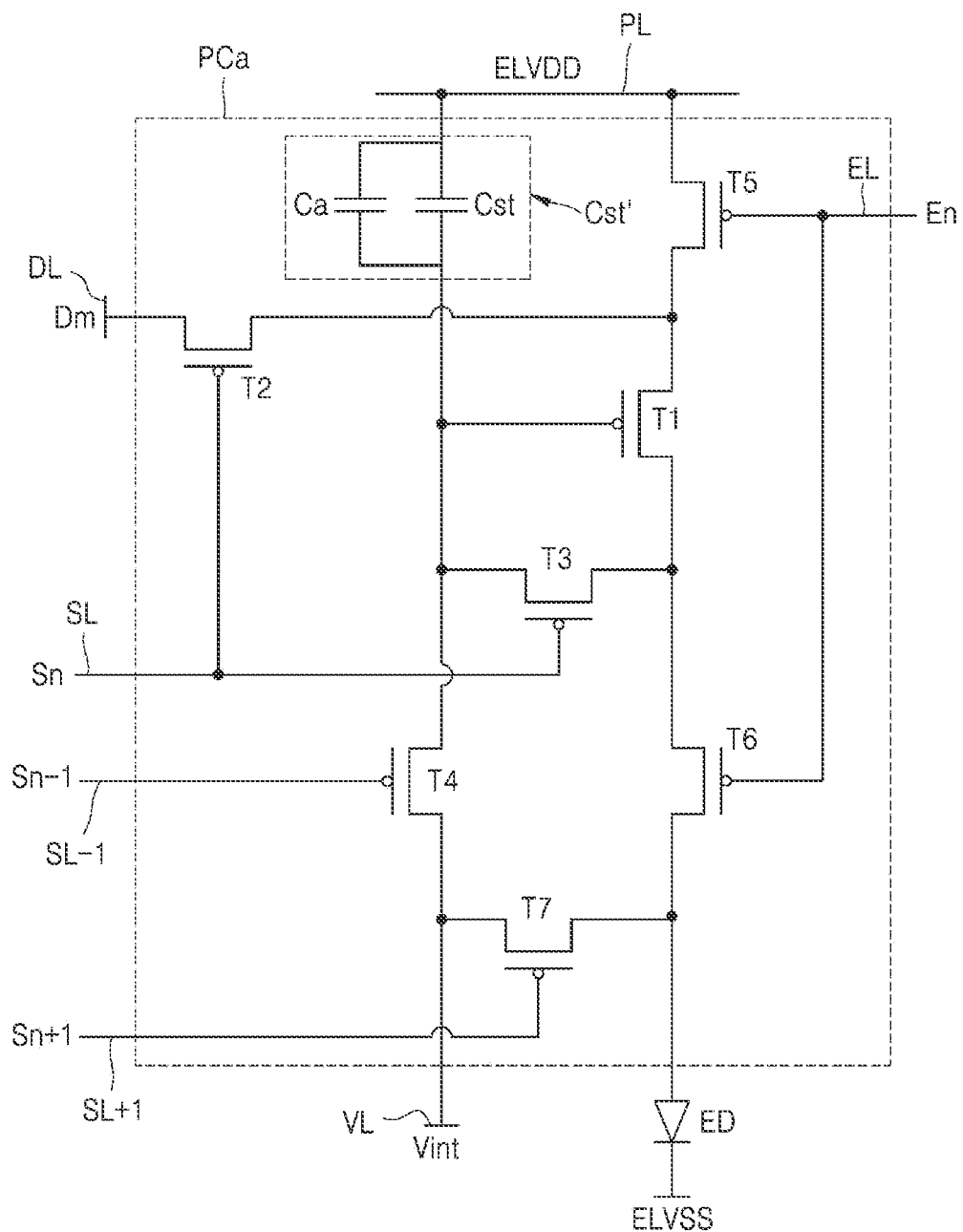
FIG. 9 is an equivalent circuit diagram of an auxiliary pixel circuit for driving an auxiliary sub-pixel according to an embodiment.

FIG. 9 is an equivalent circuit diagram of the auxiliary pixel circuit PCa for driving the auxiliary sub-pixel Pa according to an embodiment.

Referring to FIG. 9, similar to the main pixel circuit PCm of FIG. 7, the auxiliary pixel circuit PCa may include the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7.

The auxiliary pixel circuit PCa may include an auxiliary storage capacitor Cst' having a greater capacity than that of the main storage capacitor Cst of the main pixel circuit PCm shown in FIG. 7. The auxiliary storage capacitor Cst' may include the main storage capacitor Cst and an additional storage capacitor Ca connected to the main storage capacitor Cst in parallel. Because the auxiliary pixel circuit PCa further includes the additional storage capacitor Ca, the capacity of the auxiliary storage capacitor Cst' of the auxiliary pixel circuit PCa may be greater than that of the main storage capacitor Cst of the main pixel circuit PCm.

A connection relationship among the thin film transistors T1 to T7 included in the auxiliary pixel circuit PCa may be the same or substantially the same as that of the main pixel circuit PCm, and thus, redundant description thereof may not be repeated.

Figure 10:
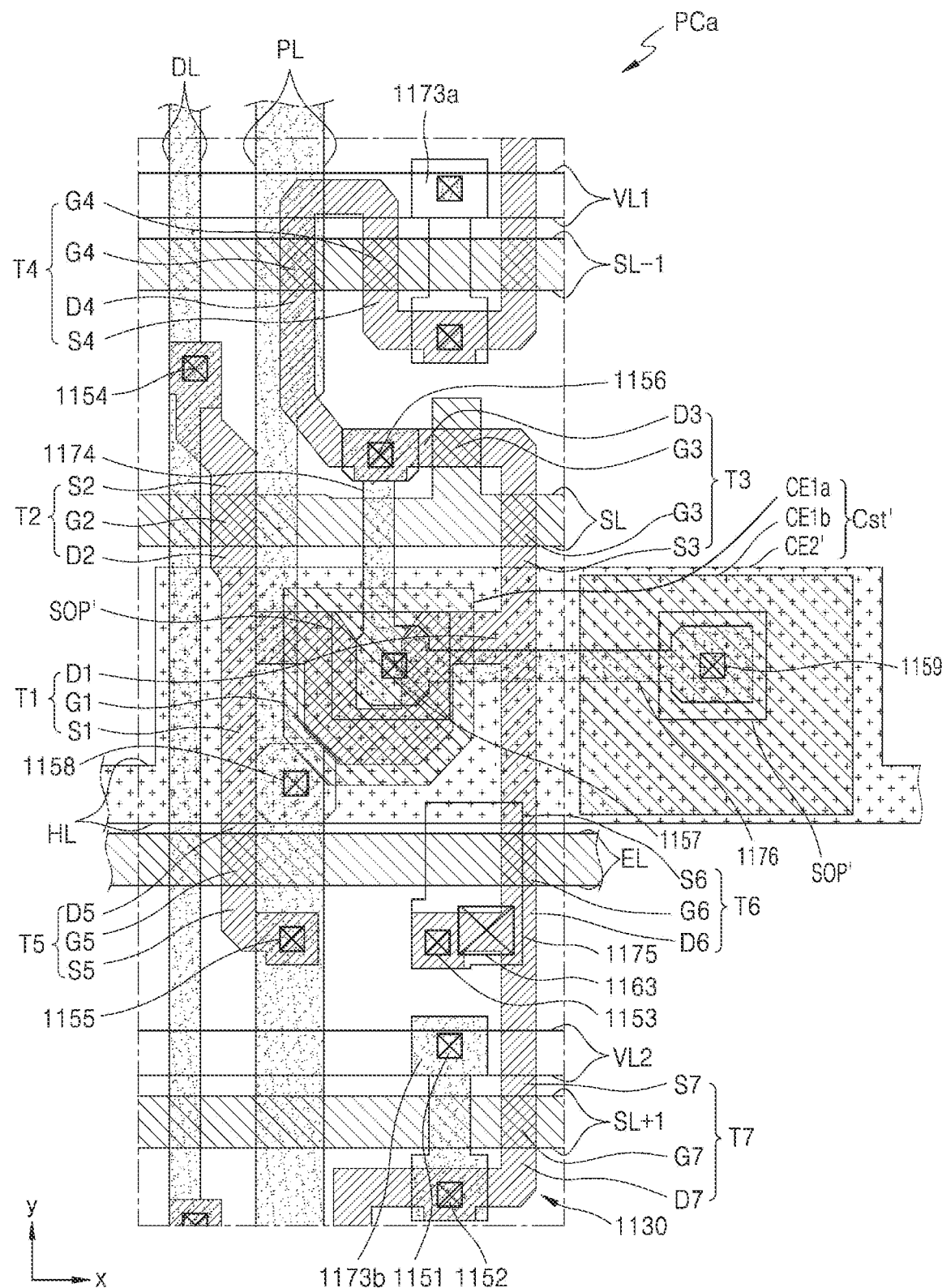
FIG. 10 is a plan view of an auxiliary pixel circuit according to an embodiment.

FIG. 10 is a plan view of an auxiliary pixel circuit according to an embodiment.

Referring to FIG. 10, similar to the main pixel circuit PCm of FIG. 8, the auxiliary pixel circuit PCa may include the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. The thin film transistors shown in FIG. 10 may have the same or substantially the same connection relationship as that of the main pixel circuit PCm described with reference to FIG. 8, and thus, redundant description thereof may not be repeated.

The auxiliary pixel circuit PCa of FIG. 10 may be different from the main pixel circuit PCm of FIG. 8, in that a size of the auxiliary storage capacitor Cst' may be greater than that of the main storage capacitor Cst.

The auxiliary storage capacitor Cst' may include a first lower electrode CE1a, a second lower electrode CE1b, and an upper electrode CE2'. The first lower electrode CE1a may also act as the gate electrode G1 of the driving thin film transistor T1. The second lower electrode CE1b is at the same layer as that of the first lower electrode CE1a, and may be spaced apart (e.g., may be separated) from the first lower electrode CE1a with the semiconductor layer 1130 therebetween on a plane. When the second lower electrode CE1b overlaps with the semiconductor layer 1130, an undesired signal may be generated, and thus, the second lower electrode CE1b may not overlap with the semiconductor layer 1130. The upper electrode CE2' may have a sufficient size to cover the first lower electrode CE1a and the second lower electrode CE1b. The first lower electrode CE1a may be connected to the second lower electrode CE1b via a bridge line 1176. The upper electrode CE2' may include two storage openings SOP', each having a single closed loop shape, and the bridge line 1176 may be connected to the first lower electrode CE1a and the second lower electrode CE1b via contact holes 1157 and 1159 in the storage openings SOP', respectively.

Figure 11:
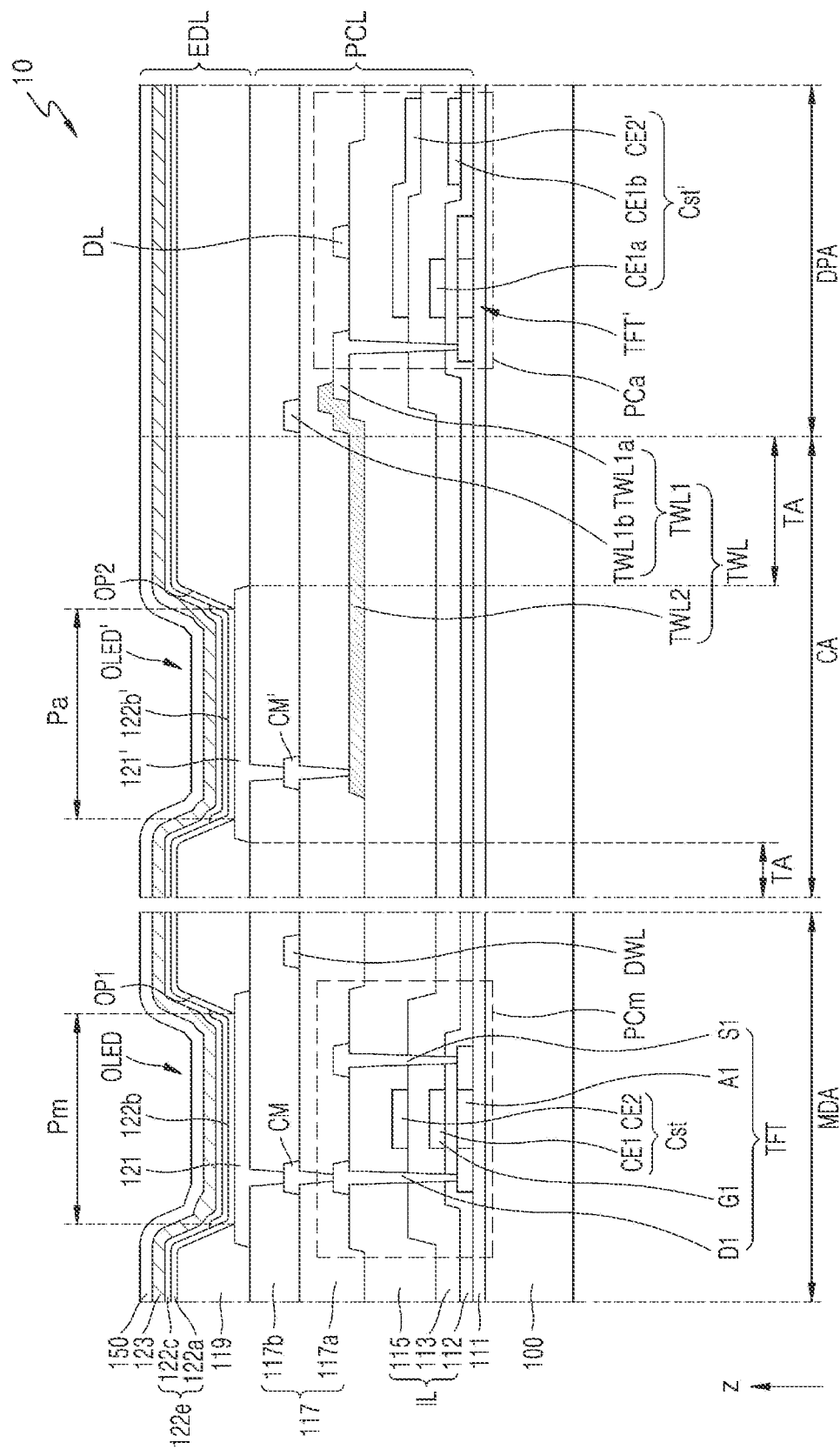
FIG. 11 is a cross-sectional view partially showing a display panel according to an embodiment.

FIG. 11 is a cross-sectional view showing a portion of the display panel 10 according to an embodiment, and partially shows the main display area MDA, the component area CA, and the peripheral area DPA.

Referring to FIG. 11, the main sub-pixels Pm are at (e.g., in or on) the main display area MDA, and the component area CA includes the auxiliary sub-pixels Pa and the transmission area TA. The main pixel circuit PCm including the main thin film transistor TFT and the main storage capacitor Cst may be at (e.g., in or on) the main display area MDA. The main organic light-emitting diode OLED that is a display element connected to the main pixel circuit PCm may be at (e.g., in or on) the main display area MDA. An auxiliary organic light-emitting diode OLED' may be at (e.g., in or on) the component area CA. The auxiliary pixel circuit PCa including an auxiliary thin film transistor TFT' and the auxiliary storage capacitor Cst' may be at (e.g., in or on) the peripheral area DPA. In addition, the connecting line TWL for connecting the auxiliary pixel circuit PCa and the auxiliary organic light-emitting diode OLED' to each other may be at (e.g., in or on) the component area CA and the peripheral area DPA.

According to the present embodiment, the organic light-emitting diode OLED, OLED' is employed as the display element. However, according to another embodiment, an inorganic light-emitting diode or a quantum dot light-emitting diode may be employed as the display element.

Hereinafter, a structure in which the elements of the display panel 10 are stacked will be described in more detail below. The display panel 10 may include a substrate 100, a buffer layer 111, a circuit layer PCL, and a display element layer EDL that are stacked on one another.

The substrate 100 may include an insulative material, for example, such as glass, quartz, and/or polymer resin. The substrate 100 may be a rigid substrate, or may be a flexible substrate that is bendable, foldable, and/or rollable.

The buffer layer 111 may be positioned on the substrate 100, and may reduce or prevent infiltration of a foreign material, moisture, and/or ambient air from below the substrate 100. The buffer layer 111 may provide a flat or substantially flat surface on the substrate 100. The buffer layer 111 may include an inorganic material, for example, such as an oxide or a nitride, an organic material, or an organic-inorganic composite material, and may have a single layer structure or a multilayered structure including an inorganic material and/or an organic material. In some embodiments, a barrier layer may be further included between the substrate 100 and the buffer layer 111 to block or substantially block penetration of ambient air. In some embodiments, the buffer layer 111 may include silicon dioxide (SiO2) or silicon nitride (SiN$_x$).

The circuit layer PCL is on the buffer layer 111, and may include the main and auxiliary pixel circuits PCm and PCa, a first gate insulating layer 112, a second gate insulating layer 113, an interlayer insulating layer 115, and a planarization layer 117. The main pixel circuit PCm may include the main thin film transistor TFT and the main storage capacitor Cst, and the auxiliary pixel circuit PCa may include the auxiliary thin film transistor TFT' and the auxiliary storage capacitor Cst'.

The main thin-film transistor TFT and/or the auxiliary thin-film transistor TFT' may be above the buffer layer 111. The main thin film transistor TFT includes the first semiconductor layer A1, the first gate electrode G1, the first source electrode S1, and the first drain electrode D1. The main thin-film transistor TFT may be connected to the main organic light-emitting diode OLED, and may drive the main organic light-emitting diode OLED. The auxiliary thin film transistor TFT' is connected to the auxiliary organic light-emitting diode OLED', and may drive the auxiliary organic light-emitting diode OLED'. The auxiliary thin film transistor TFT' has the same or substantially the same (or a similar) configuration to that of the main thin film transistor TFT, and thus, redundant description thereof may not be repeated.

The first semiconductor layer A1 is on the buffer layer 111, and may include polysilicon. In another embodiment, the first semiconductor layer A1 may include amorphous silicon. In another embodiment, the first semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel region, and a source region and a drain region doped with impurities.

The first gate insulating layer 112 may cover the first semiconductor layer A1. The first gate insulating layer 112 may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may be a single layer or multi-layers including one or more of the aforementioned inorganic insulating materials.

The first gate electrode G1 is on the first gate insulating layer 112 to overlap with the first semiconductor layer A1. The first gate electrode G1 may include molybdenum (Mo), aluminum (Al), copper (Cu), titanium (Ti), and/or the like, and may have a single-layer structure or a multi-layered structure. As an example, the first gate electrode G1 may have a single layer including Mo.

The second gate insulating layer 113 may cover the first gate electrode G1. The second gate insulating layer 113 may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second gate insulating layer 113 may be a single layer or multi-layers including one or more of the aforementioned inorganic insulating materials.

An upper electrode CE2 of the main storage capacitor Cst and the upper electrode CE2' of the auxiliary storage capacitor Cst' may be on the second gate insulating layer 113.

At (e.g., in or on) the main display area MDA, the upper electrode CE2 of the main storage capacitor Cst may overlap with the first gate electrode G1 thereunder. The first gate electrode G1 and the upper electrode CE2 overlapping with each other with the second gate insulating layer 113 therebetween may configure the main storage capacitor Cst. The first gate electrode G1 may be a lower electrode CE1 of the main storage capacitor Cst.

At (e.g., in or on) the peripheral area DPA, the upper electrode CE2' of the auxiliary storage capacitor Cst' may overlap with the gate electrode of the auxiliary thin film transistor TFT' thereunder. The gate electrode of the auxiliary thin film transistor TFT' may be the first lower electrode CE1a of the auxiliary storage capacitor Cst'. The auxiliary storage capacitor Cst' may further include the second lower electrode CE1b that is at the same layer as that of the first lower electrode CE1a. The upper electrode CE2' of the auxiliary storage capacitor Cst' may overlap with the first lower electrode CE1a and the second lower electrode CE1b. The first lower electrode CE1a and the second lower electrode CE1b may be electrically connected to each other. According to the above described configuration, a capacitance of the auxiliary storage capacitor Cst' may be greater than that of the main storage capacitor Cst.

The upper electrodes CE2 and CE2' may each include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layer structure or a multi-layered structure.

The interlayer insulating layer 115 may cover the upper electrodes CE2 and CE2'. The interlayer insulating layer 115 may include an insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The insulating interlayer 115 may be a single layer or multiple layers including one or more of the inorganic insulating materials described above.

The source electrode S1 and the drain electrode D1 may be on the interlayer insulating layer 115. The source electrode S1 and the drain electrode D1 may include a conductive material including Mo, Al, Cu, Ti, and/or the like, and may have a single-layer structure or multi-layered structure including one or more of the above materials. For example, the source electrode S1 and the drain electrode D1 may each have a multi-layered structure including Ti/Al/Ti.

The connecting line TWL that is connected to the auxiliary pixel circuit PCa may be on the interlayer insulating layer 115. The connecting line TWL extends from the peripheral area DPA to the component area CA, and may connect the auxiliary organic light-emitting diode OLED' to the auxiliary pixel circuit PCa. The data line DL may be on the interlayer insulating layer 115.

The connecting line TWL may include the first connecting line TWL1 and the second connecting line TWL2. The first connecting line TWL1 is at (e.g., in or on) the peripheral area DPA, and may be connected to the auxiliary pixel circuit PCa, for example, to the auxiliary thin film transistor TFT'. The second connecting line TWL2 may be connected to the first connecting line TWL1, and may be at (e.g., in or on) the transmission area TA of the component area CA. The second connecting line TWL2 may be at the same layer as that of the first connecting line TWL1, and may include a material different from that of the first connecting line TWL1. An end of the second connecting line TWL2 may cover an end of the first connecting line TWL1.

The first connecting line TWL1 may include a conductive material including molybdenum (Mo), aluminum (Al), copper (Cu), titanium (Ti), and/or the like, and may have a single-layer structure or a multi-layered structure. The first connecting line TWL1 may include the 1-1st connecting line TWL1a and the 1-2nd connecting line TWL1b at different layers from each other. In some embodiments, the 1-1st connecting line TWL1a may be at the same layer as that of the data line DL, and may include the same or substantially the same material as that of the data line DL. The 1-2nd connecting line TWL1b and the 1-1st connecting line TWL1a may be arranged with a first planarization layer 117a therebetween. The 1-2nd connecting line TWL1b may be on the first planarization layer 117a, and at the same layer as that of the connecting electrodes CM and CM'. In another embodiment, the 1-2nd connecting line TWL1b may be at the same layer as that of the upper electrode CE2 or as that of the lower electrode CE1 of the main storage capacitor Cst.

The second connecting line TWL2 may include a transparent conductive material. For example, the second connecting line TWL2 may include a transparent conducting oxide (TCO). The second connecting line TWL2 may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO).

The first connecting line TWL1 may have a higher conductivity than that of the second connecting line TWL2. Because the first connecting line TWL1 is at (e.g., in or on) the peripheral area DPA, there may be no need to ensure light transmittance. Thus, the first connecting line TWL1 may include a material having a lower light transmittance and a higher conductivity than that of the second connecting line TWL2. Accordingly, a resistance of the connecting line TWL may be reduced.

The planarization layer 117 may cover the source electrodes S1 and S2, the drain electrodes D1 and D2, and the connecting line TWL. The planarization layer 117 may have a flat or substantially flat upper surface, such that a first pixel electrode 121 and a second pixel electrode 121' that are located thereon may be formed to be flat or substantially flat.

The planarization layer 117 may include an organic material or an inorganic material, and may have a single layer structure or a multi-layered structure. The planarization layer 117 may include a first planarization layer 117a and a second planarization layer 117b. Accordingly, a conductive pattern, for example, such as a wire, may be provided between the first planarization layer 117a and the second planarization layer 117b, and thus, may be favorable to high integration. The connecting electrodes CM and CM' and the data connecting line DWL may be on the first planarization layer 117a.

The planarization layer 117 may include a general universal polymer (benzocyclobutene (BCB), a polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and/or the like. The planarization layer 117 may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). When the planarization layer 117 is formed, a layer may be formed, and then chemical and mechanical polishing may be performed on an upper surface of the layer to provide a flat or substantially flat upper surface.

The first planarization layer 117a may cover the main and auxiliary pixel circuits PCm and PCa. The second planarization layer 117b is on the first planarization layer 117a, and may have the flat or substantially flat upper surface such that the pixel electrodes 121 and 121' may be formed to be flat or substantially flat.

The main and auxiliary organic light-emitting diodes OLED and OLED' are on the second planarization layer 117b. The pixel electrodes 121 and 121' of the organic light-emitting diodes OLED and OLED' may be connected to the pixel circuits PCm and PCa via the connecting electrodes CM and CM' on the first planarization layer 117a.

The first pixel electrode 121 and the second pixel electrode 121' may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO). The first and second pixel electrodes 121 and 121' may each include a reflective layer including, for example, argentum (Ag), magnesium (Mg), aluminum (Al), platinum (Pt), palladium (Pd), aurum (Au), nickel (Ni), neodymium (Nd), iridium (Ir), chrome (Cr), or a compound thereof. For example, each of the first and second pixel electrodes 121 and 121' may have a structure including one or more films including ITO, IZO, ZnO, or In2O3 above/below the aforementioned reflection layer. In this case, each of the first and second pixel electrodes 121 and 121' may have a stacked structure of ITO/Ag/ITO.

The pixel defining layer 119 is on the planarization layer 117, and covers edges of the first and second pixel electrodes 121 and 121'. The pixel defining layer 119 may include a first opening OP1 and a second opening OP2 exposing central portions of the first and second pixel electrodes 121 and 121', respectively. The first opening OP1 and the second opening OP2 define the sizes and shapes of the light-emission areas of the main and auxiliary organic light-emitting diodes OLED and OLED', namely, the main and auxiliary subpixels Pm and Pa, respectively.

The pixel defining layer 119 increases a distance between an edge of each of the first and second pixel electrodes 121 and 121' and an opposite electrode 123 on the pixel electrodes 121 and 121' to prevent or substantially prevent the generation of an arc at the edges of the pixel electrodes 121 and 121'. The pixel-defining layer 119 may include an organic insulating material, for example, such as polyimide, polyamide, acrylic resin, benzocyclobutene, hexamethyldisiloxane (HMDSO), and/or phenolic resin, and may be formed by spin coating and/or the like.

A first emission layer 122b and a second emission layer 122b' corresponding to the first pixel electrode 121 and the second pixel electrode 121' are in the first opening OP1 and the second opening OP2, respectively, of the pixel defining layer 119. The first emission layer 122b and the second emission layer 122b' may include a high molecular weight material or a low molecular weight material, and may each emit one of a red light, a green light, a blue light, or a white light.

An organic functional layer 122e may be on and/or under the first and second emission layers 122b and 122b'. The organic functional layer 122e may include a first functional layer 122a and/or a second functional layer 122c. The first functional layer 122a or the second functional layer 122c may be omitted.

The first functional layer 122a may be under (e.g., underneath) the first emission layer 122b and the second emission layer 122b'. The first functional layer 122a may have a single-layer structure or a multi-layered structure including an organic material. The first functional layer 122a may be a hole transport layer (HTL) that is a single layer. As another example, the first functional layer 122a may include a hole injection layer (HIL) and an HTL. The first functional layer 122a may be integrally provided to correspond to the main and auxiliary organic light-emitting diodes OLED and OLED' included at (e.g., in or on) the main display area MDA and the component area CA, respectively.

The second functional layer 122c may be above the first emission layer 122b and the second emission layer 122b'. The second functional layer 122c may have a single-layer structure or a multi-layered structure including an organic material. The second functional layer 122c may include an electron transport layer (ETL) and/or an electron injection layer (EIL). The second functional layer 122c may be integrally provided to correspond to the main and auxiliary organic light-emitting diodes OLED and OLED' included at (e.g., in or on) the main display area MDA and the component area CA, respectively.

The opposite electrode 123 is above the second functional layer 122c. The opposite electrode 123 may include a conductive material having a low work function. For example, the opposite electrode 123 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. As another example, the opposite electrode 123 may further include a layer, for example, such as ITO, IZO, ZnO, or In2O3, on the (semi)transparent layer including any one or more of the above-described materials. The opposite electrode 123 may be integrally provided to correspond to the organic light-emitting diodes OLED and OLED' at (e.g., in or on) the main display area MDA and the component area CA, respectively.

The layers from the first pixel electrode 121 to the opposite electrode 123 at (e.g., in or on) the main display area MDA may configure the main organic light-emitting diode OLED. The layers from the second pixel electrode 121' to the opposite electrode 123 at (e.g., in or on) the component area CA may configure the auxiliary organic light-emitting diode OLED'.

An upper layer 150 including an organic material may be on the opposite electrode 123. The upper layer 150 may be provided to protect the opposite electrode 123, and may also increase light extraction efficiency. The upper layer 150 may include an organic material having a higher refractive index than that of the opposite electrode 123. As another example, the upper layer 150 may include a plurality of stacked layers having different refractive indices from one another. For example, the upper layer 150 may include a high refractive index layer/low refractive index layer/high refractive index layer. In this case, a refractive index of the high refractive index layer may be about 1.7 or more, and a refractive index of the low refractive index layer may be about 1.3 or less.

The upper layer 150 may additionally include lithium fluoride (LiF). As another example, the upper layer 150 may additionally include an inorganic insulating material, for example, such as silicon oxide ($SiO_2$) and/or silicon nitride (SiNx).

Figure 12:
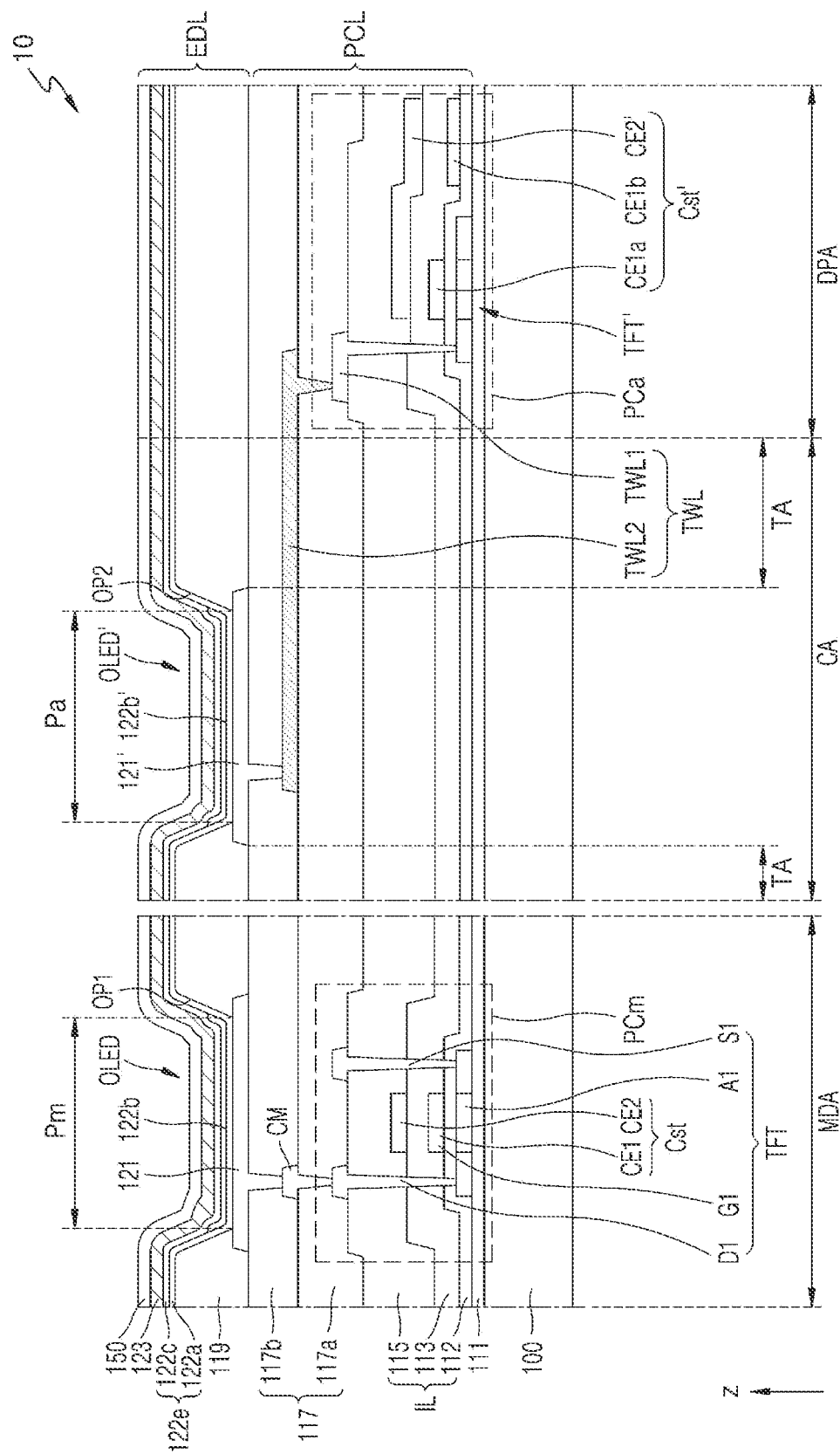
FIG. 12 is a cross-sectional view partially showing a display panel according to an embodiment.

FIG. 12 is a cross-sectional view partially showing the display panel 10 according to an embodiment. In FIG. 12, the same reference numerals are used to denote the same or substantially the same elements, members, or layers as those of FIG. 11, and thus, redundant description thereof may not be repeated.

Referring to FIG. 12, the display panel 10 may include the main display area MDA, the component area CA, and the peripheral area DPA. The main sub-pixels Pm are at (e.g., in or on) the main display area MDA, and the component area CA includes the auxiliary sub-pixels Pa and the transmission area TA. The main pixel circuit PCm including the main thin film transistor TFT and the main storage capacitor Cst may be at (e.g., in or on) the main display area MDA. The main organic light-emitting diode OLED that is a display element connected to the main pixel circuit PCm may be at (e.g., in or on) the main display area MDA. The auxiliary organic light-emitting diode OLED' may be at (e.g., in or on) the component area CA. The auxiliary pixel circuit PCa including an auxiliary thin film transistor TFT' and the auxiliary storage capacitor Cst' may be at (e.g., in or on) the peripheral area DPA. In addition, the connecting line TWL for connecting the auxiliary pixel circuit PCa and the auxiliary organic light-emitting diode OLED' to each other may be at (e.g., in or on) the component area CA and the peripheral area DPA.

The connecting line TWL may include the first connecting line TWL1 and the second connecting line TWL2. The first connecting line TWL1 may be at (e.g., in or on) the peripheral area DPA, and may be connected to the auxiliary pixel circuit PCa. The second connecting line TWL2 may be at (e.g., in or on) the component area CA, and may be connected to the auxiliary organic light-emitting diode OLED'.

In the present embodiment, the second connecting line TWL2 may be at a different layer from that of the first connecting line TWL1. For example, the first connecting line TWL1 may be on the interlayer insulating layer 115, and the second connecting line TWL2 may be on the first planarization layer 117a.

The first connecting line TWL1 and the second connecting line TWL2 may be connected to each other at or near (e.g., adjacent to) the boundary between the component area CA and the peripheral area DPA via a contact hole penetrating through the first planarization layer 117a.

The second connecting line TWL2 may include a transparent conductive oxide material having a high light transmittance, and the first connecting line TWL1 may include a material having a high conductivity.

Figure 13:
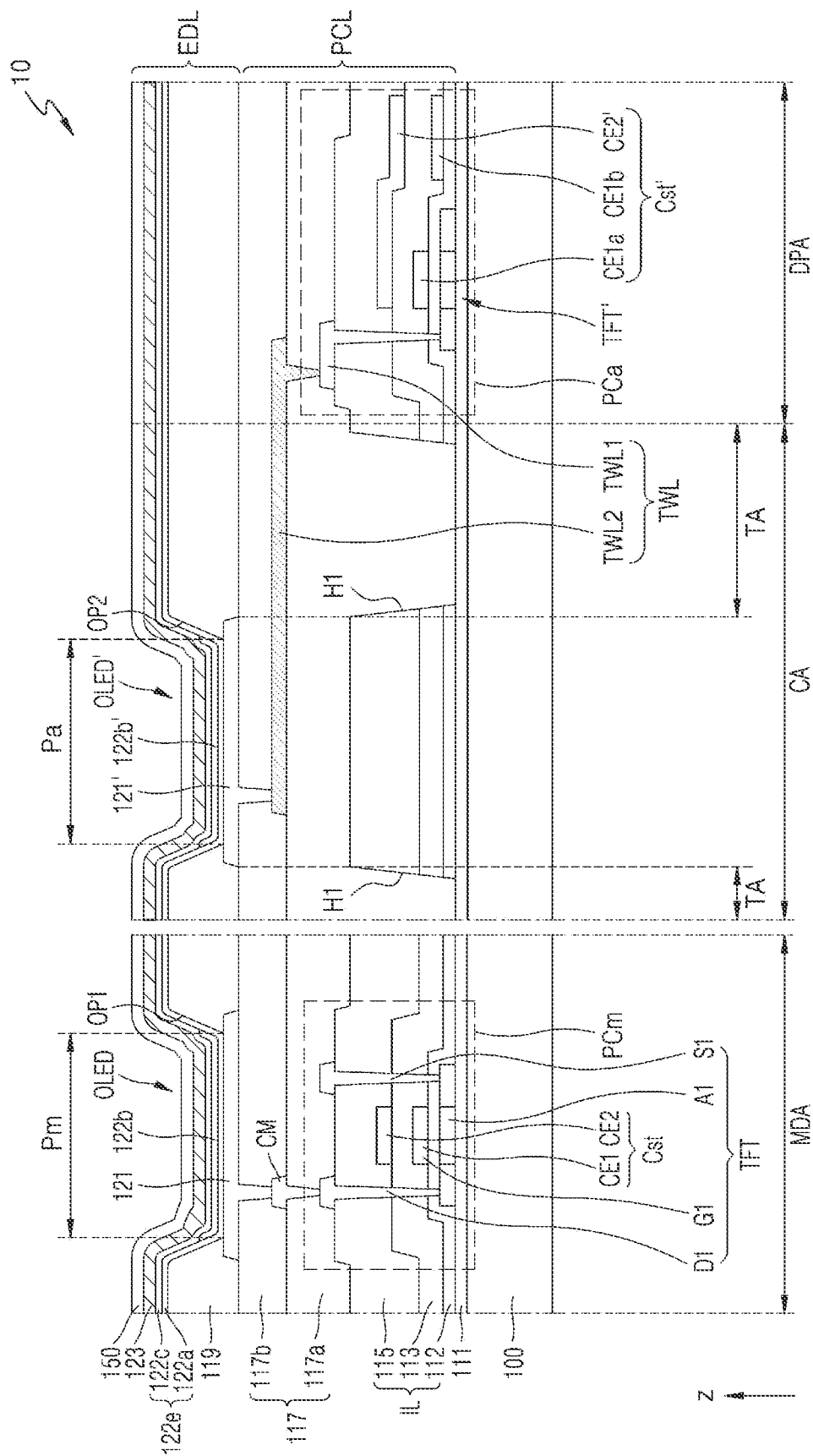
FIG. 13 is a schematic cross-sectional view of a portion of a display panel according to an embodiment.

FIG. 13 is a cross-sectional view partially showing the display panel 10 according to an embodiment. In FIG. 13, the same reference numerals are used to denote the same or substantially the same elements, members, or layers as those of FIG. 12, and thus, redundant description thereof may not be repeated.

Referring to FIG. 13, the display panel 10 may include the main display area MDA, the component area CA, and the peripheral area DPA. The main sub-pixels Pm are at (e.g., in or on) the main display area MDA, and the component area CA includes the auxiliary sub-pixels Pa and the transmission area TA. The main pixel circuit PCm including the main thin film transistor TFT and the main storage capacitor Cst may be at (e.g., in or on) the main display area MDA. The main organic light-emitting diode OLED that is a display element connected to the main pixel circuit PCm may be at (e.g., in or on) the main display area MDA. The auxiliary organic light-emitting diode OLED' may be at (e.g., in or on) the component area CA. The auxiliary pixel circuit PCa including an auxiliary thin film transistor TFT' and the auxiliary storage capacitor Cst' may be at (e.g., in or on) the peripheral area DPA. In addition, the connecting line TWL for connecting the auxiliary pixel circuit PCa and the auxiliary organic light-emitting diode OLED' to each other may be at (e.g., in or on) the component area CA and the peripheral area DPA.

In the present embodiment, an inorganic insulating layer IL of the display panel 10 may have a hole or a groove corresponding to the transmission area TA.

For example, when the first gate insulating layer 112, the second gate insulating layer 113, and the interlayer insulating layer 115 are collectively referred to as the inorganic insulating layer IL, the interlayer insulating layer IL may include a first hole H1 corresponding to the transmission area TA. The first hole H1 may expose a portion of the upper surface of the buffer layer 111, or a portion of the upper surface of the substrate 100. The first hole H1 may be formed by overlapping an opening of the first gate insulating layer 112, an opening of the second gate insulating layer 113, and an opening of the interlayer insulating layer 115 that correspond to the transmission area TA with each other. These openings may be individually formed through separate processes, or may be concurrently (e.g., simultaneously) formed through the same process. When these openings are formed through separate processes, the inner surface of the first hole H1 may not be smooth, and may have steps such as a staircase shape.

As another example, the inorganic insulating layer IL may include a groove, instead of the first hole H1 exposing the buffer layer 111. As another example, the inorganic insulating layer IL may not have the first hole H1 or the groove corresponding to the transmission area TA.

The first planarization layer 117a may be filled in the first hole H1 or the groove of the inorganic insulating layer IL. In some embodiments, the first planarization layer 117a and the second planarization layer 117b may include a transparent organic material having a refractive index that is the same or substantially the same as (or similar to) those of the substrate 100 and the buffer layer 111. For example, the first planarization layer 117a and the second planarization layer 117b may include a siloxane-based organic material having a high light transmittance. Examples of the siloxane-based organic material may include hexamethyldisiloxane, octamethyltrisiloxane, decamethyltetrasiloxane, dodecamethylpentasiloxane, and polydimethylsiloxanes.

Corresponding to the transmission area TA, a portion of the inorganic insulating layer IL is removed, and the planarization layer 117 having a similar (e.g., the same or substantially the same) refractive index as those of the substrate 100 and the buffer layer 111 is arranged, and thus, loss of the light transmittance due to a difference between the refractive indices thereof may be reduced.

Figure 14:
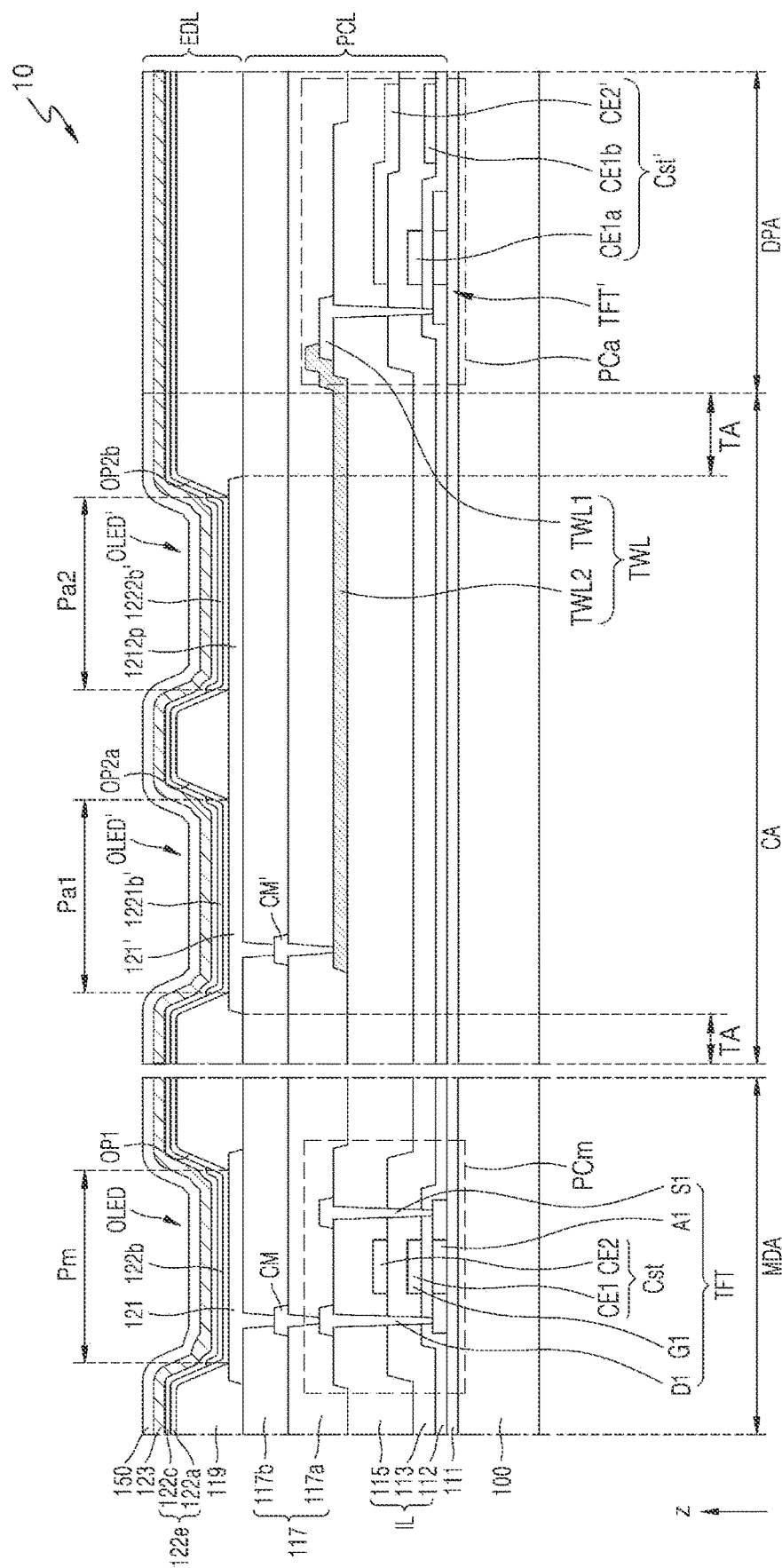
FIG. 14 is a cross-sectional view partially showing a display panel according to an embodiment.

FIG. 14 is a cross-sectional view partially showing the display panel 10 according to an embodiment. In FIG. 14, the same reference numerals are used to denote the same or substantially the same elements, members, or layers as those of FIG. 11, and thus, redundant description thereof may not be repeated.

Referring to FIG. 14, the display panel 10 may include the main display area MDA, the component area CA, and the peripheral area DPA. The main sub-pixels Pm are at (e.g., in or on) the main display area MDA, and the component area CA includes the auxiliary sub-pixels Pa and the transmission area TA. The main pixel circuit PCm including the main thin film transistor TFT and the main storage capacitor Cst may be at (e.g., in or on) the main display area MDA. The main organic light-emitting diode OLED that is a display element connected to the main pixel circuit PCm may be at (e.g., in or on) the main display area MDA. The auxiliary organic light-emitting diode OLED' may be at (e.g., in or on) the component area CA. The auxiliary pixel circuit PCa including an auxiliary thin film transistor TFT' and the auxiliary storage capacitor Cst' may be at (e.g., in or on) the peripheral area DPA. In addition, the connecting line TWL for connecting the auxiliary pixel circuit PCa and the auxiliary organic light-emitting diode OLED' to each other may be at (e.g., in or on) the component area CA and the peripheral area DPA.

In the present embodiment, one auxiliary organic light-emitting diode OLED' may have a plurality of light-emitting regions. For example, one auxiliary organic light-emitting diode OLED' may have two light-emitting regions, and the two light-emitting regions may correspond to a first auxiliary sub-pixel Pa1 and a second auxiliary sub-pixel Pa2, respectively.

The pixel defining layer 119 may include a 2-1st opening OP2a exposing the second pixel electrode 121', and a 2-2nd opening OP2b exposing a second pixel electrode portion 1212p to define the light-emitting regions.

A 2-1st emission layer 1221b' may be in the 2-1st opening OP2a, and a 2-2nd emission layer 1222b' may be in the 2-2nd opening OP2b. The 2-1st emission layer 1221b' may emit light of the same color as that emitted from the 2-2nd emission layer 1222b'. As another example, the 2-1st emission layer 1221b' and the 2-2nd emission layer 1222b' may emit light of different colors from each other.

Because the first auxiliary sub-pixel Pa1 and the second auxiliary sub-pixel Pa2 are driven via the same auxiliary pixel circuit PCa, the first and second auxiliary sub-pixels Pa1 and Pa2 may concurrently (e.g., simultaneously) emit light. As described above, because the plurality of auxiliary sub-pixels Pa1 and Pa2 may be realized by one display element, visibility of the component region may be improved.

Figure 15:
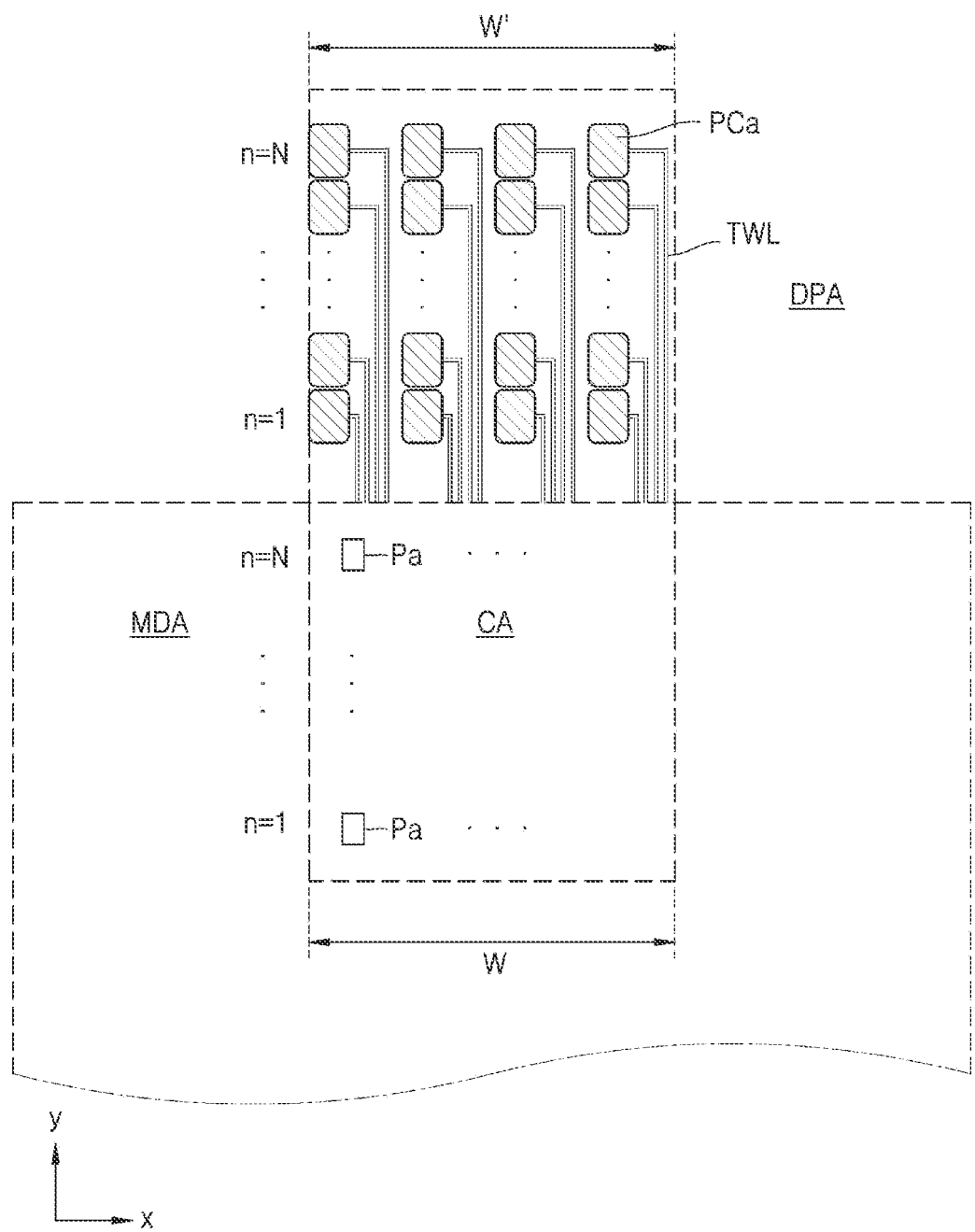
FIG. 15 is a plan view showing an arrangement of auxiliary pixel circuits according to an embodiment.
Figure 16:
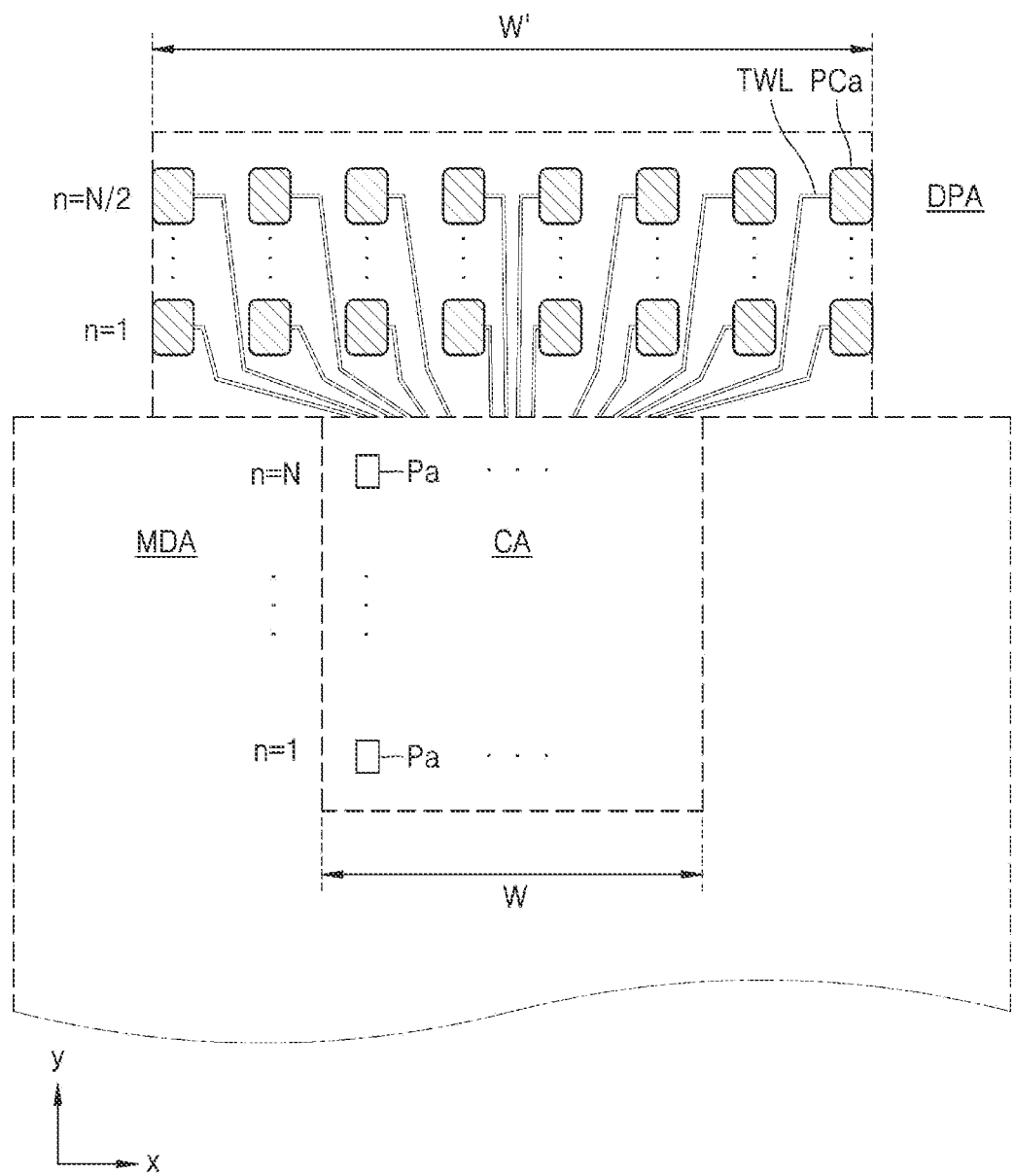
FIG. 16 is a plan view showing an arrangement of auxiliary pixel circuits according to an embodiment.
Figure 17:
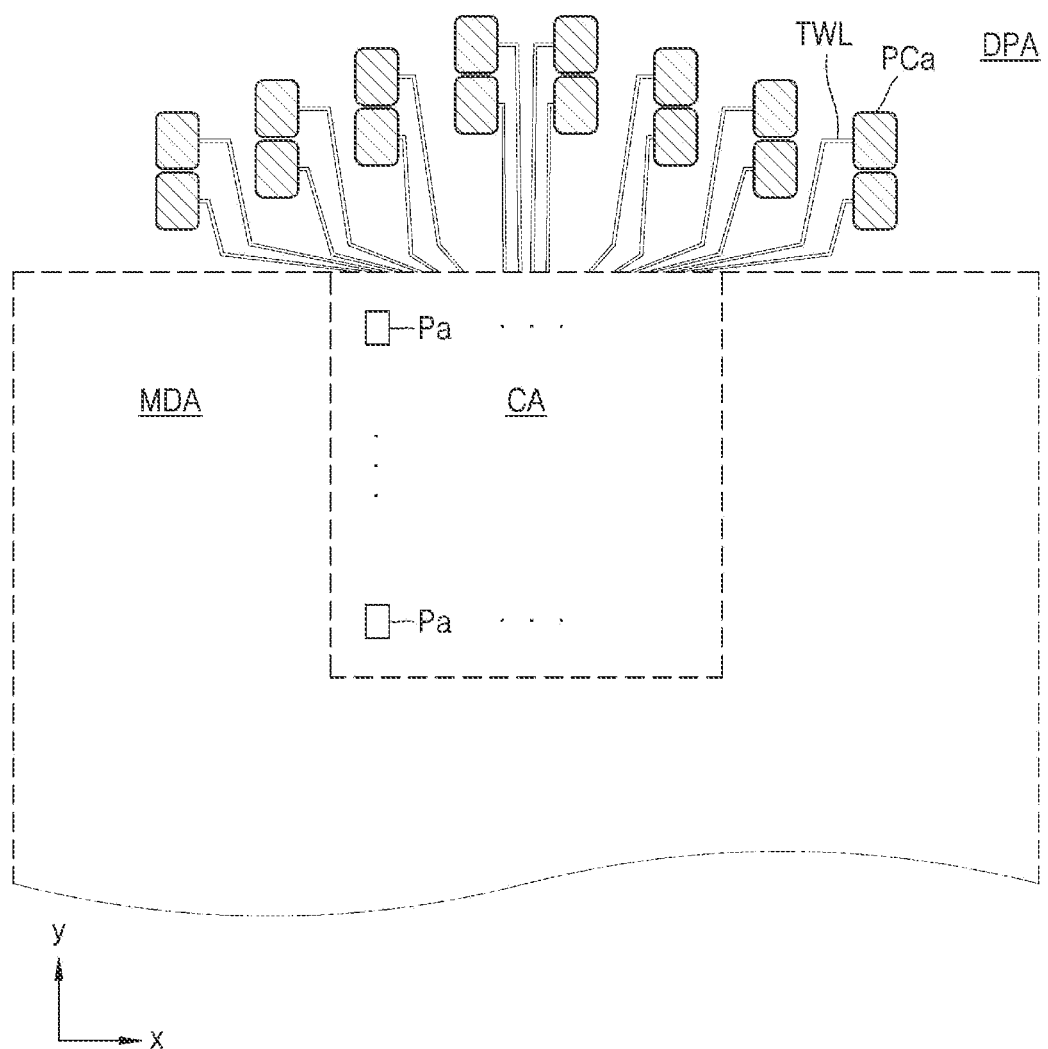
FIG. 17 is a plan view showing an arrangement of auxiliary pixel circuits according to an embodiment.

FIGS. 15 to 17 are plan views showing an arrangement of the auxiliary pixel circuits PCa according to one or more embodiments.

Referring to FIG. 15, the auxiliary pixel circuits PCa may be at (e.g., in or on) the peripheral area DPA to be adjacent to the component area CA. When N auxiliary sub-pixels Pa are arranged at (e.g., in or on) the component area CA in the y-direction, N auxiliary pixel circuits PCa may be arranged at (e.g., in or on) the peripheral area DPA in the y-direction (where N is an integer). In this case, the connecting line TWL may extend in the y-direction. The number of connecting lines TWL at (e.g., in or on) the component area CA may be equal to or substantially equal to the number of auxiliary pixel circuits PCa at (e.g., in or on) the peripheral area DPA. The auxiliary pixel circuits PCa may be above the component area CA, and a width W' occupied by the auxiliary pixel circuits PCa may be the same or substantially the same as the width W of the component area CA.

Referring to FIG. 16, when N auxiliary sub-pixels Pa are arranged at (e.g., in or on) the component area CA in the y-direction, N/2 auxiliary pixel circuits PCa may be arranged at (e.g., in or on) the peripheral area DPA in the y-direction (where N is an integer). The auxiliary pixel circuits PCa may be above the component area CA and the main display area MDA, and the width W' occupied by the auxiliary pixel circuits PCa may be greater than the width W of the component area CA. In this case, interference between the connecting lines TWL may be reduced. The number of the auxiliary pixel circuits PCa in the y-direction may be variously designed by taking into account the size of the peripheral area DPA.

Referring to FIG. 17, the auxiliary pixel circuits PCa at (e.g., in or on) the peripheral area DPA may be spread in a fan shape by taking into account the distance from the component area CA. As another example, the auxiliary pixel circuits PCa may be arranged in a stair shape from the edge toward the center of the display panel. This may be designed considering the length of the connecting line TWL for connecting the auxiliary pixel circuit PCa to the auxiliary sub-pixel Pa. As the lengths of the connecting lines TWL are consistent, a variation in image quality between the auxiliary sub-pixels Pa at (e.g., in or on) the component area CA may be reduced.

As described above, in the display panel and the display apparatus according to one or more embodiments of the present disclosure, the pixel circuits may not be arranged at (e.g., in or on) the component area, and thus, a relatively wider transmission region may be ensured to thereby improving transmittance therethrough.

However, the aspects and features of the present disclosure are not limited to the above effects.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
   a substrate including a main display area and a component area;
   a main display element disposed on the main display area;
   a main pixel circuit overlapping with the main display element and electrically connected to the main display element;
   an auxiliary display element disposed on the component area; and
   an auxiliary pixel circuit disposed outside of the component area and electrically connected to the auxiliary display element, the auxiliary pixel circuit non-overlapping with the auxiliary display element in a plan view;
   wherein the auxiliary display element includes a plurality of light-emitting regions, and
   wherein a capacity of an auxiliary storage capacitor included in the auxiliary pixel circuit is greater than a capacity of a main storage capacitor included in the main pixel circuit.

2. The display panel of claim 1, wherein an area occupied by the auxiliary pixel circuit is greater than an area occupied by the main pixel circuit.

3. The display panel of claim 1, wherein the auxiliary storage capacitor comprises a first lower electrode, a second lower electrode, and an upper electrode, and
   wherein the first lower electrode and the second lower electrode are at a same layer as each other and spaced from each other.

4. The display panel of claim 1, wherein the component area includes a transmission area that at least partially surrounds the auxiliary display element.

5. The display panel of claim 4, wherein the transmission area is disposed between the auxiliary display element and the auxiliary pixel circuit.

6. The display panel of claim 1, further comprising a connecting line connecting the auxiliary display element to the auxiliary pixel circuit, and the connecting line comprises a transparent conductive oxide material.

7. The display panel of claim 6, wherein the connecting line comprises a first connecting line and a second connecting line, the first connecting line comprising a different material from that of the second connecting line, and
wherein the first connecting line and the second connecting line are at a same layer as each other, and an end of the second connecting line covers an end of the first connecting line.

8. The display panel of claim 6, wherein the connecting line comprises a first connecting line and a second connecting line, the first connecting line comprising a different material from that of the second connecting line, and
wherein the first connecting line and the second connecting line are at different layers from each other and connected to each other via a contact hole.

9. The display panel of claim 1, further comprising:
an inorganic insulating layer between the substrate and the auxiliary display element; and
a planarization layer between the inorganic insulating layer and the auxiliary display element,
wherein the inorganic insulating layer has a hole or a groove at the component area, and the planarization layer is filled in the hole or the groove.

10. The display panel of claim 1, wherein at least one of the main display element or the auxiliary display element includes a pixel electrode, a first light-emitting region, a second light-emitting region, and an opposing electrode, and
wherein the first light-emitting region and the second light-emitting region are spaced apart from each other on the pixel electrode.

11. A display apparatus comprising:
a display panel; and
a component under the display panel,
the display panel comprising:
a substrate including a main display area and a component area;
a main display element disposed on the main display area;
a main pixel circuit overlapping with the main display element and electrically connected to the main display element;
an auxiliary display element disposed on the component area; and
an auxiliary pixel circuit disposed outside of the component area and electrically connected to the auxiliary display element, the auxiliary pixel circuit non-overlapping with the auxiliary display element in a plan view;
wherein the auxiliary display element includes a plurality of light-emitting regions, and
wherein a capacity of an auxiliary storage capacitor included in the auxiliary pixel circuit is greater than a capacity of a main storage capacitor included in the main pixel circuit.

12. The display apparatus of claim 11, wherein an area occupied by the auxiliary pixel circuit is greater than an area occupied by the main pixel circuit.

13. The display apparatus of claim 11, wherein the component overlaps with the component area.

14. The display apparatus of claim 11, wherein the component area includes a transmission area that at least partially surrounds the auxiliary display element.

15. The display apparatus of claim 14, wherein the transmission area is disposed between the auxiliary display element and the auxiliary pixel circuit.

16. The display apparatus of claim 11, further comprising a connecting line connecting the auxiliary display element to the auxiliary pixel circuit, and the connecting line comprises a transparent conductive oxide material.

17. The display apparatus of claim 16, wherein the connecting line comprises a first connecting line and a second connecting line, the first connecting line comprising a different material from that of the second connecting line, and
wherein the first connecting line and the second connecting line are at a same layer as each other, and an end of the second connecting line covers an end of the first connecting line.

18. The display apparatus of claim 16, wherein the connecting line comprises a first connecting line and a second connecting line, the first connecting line comprising a different material from that of the second connecting line, and
wherein the first connecting line and the second connecting line are at different layers from each other and connected to each other via a contact hole.

19. The display apparatus of claim 11, further comprising:
an inorganic insulating layer between the substrate and the auxiliary display element; and
a planarization layer between the inorganic insulating layer and the auxiliary display element,
wherein the inorganic insulating layer has a hole or a groove at the component area, and the planarization layer is filled in the hole or the groove.

20. The display apparatus of claim 11, wherein at least one of the main display element or the auxiliary display element includes a pixel electrode, a first light-emitting region, a second light-emitting region, and an opposing electrode, and
wherein the first light-emitting region and the second light-emitting region are spaced apart from each other on the pixel electrode.

* * * * *